(12) United States Patent (10) Patent No.: US 7,605,535 B2
Kobayashi (45) Date of Patent: Oct. 20, 2009

(54) ELECTROLUMINESCENT DEVICE AND ELECTRONIC APPARATUS

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 498 days.

(21) Appl. No.: 11/281,555

(22) Filed: Nov. 18, 2005

(65) Prior Publication Data

US 2006/0108919 A1  May 25, 2006

(30) Foreign Application Priority Data

Nov. 22, 2004 (JP) .............................. 2004-336990
Sep. 6, 2005 (JP) .............................. 2005-257551

(51) Int. Cl.
  *H05B 33/22* (2006.01)
(52) U.S. Cl. ........................ 313/506; 313/112; 313/504
(58) Field of Classification Search ........................ None
  See application file for complete search history.

(56) References Cited

U.S. PATENT DOCUMENTS 5,554,911 A    9/1996  Nakayama et al.

(Continued)

FOREIGN PATENT DOCUMENTS

JP        A-06-132081        5/1994

(Continued)

*Primary Examiner*—Ashok Patel
(74) *Attorney, Agent, or Firm*—Oliff & Berridge, PLC

(57) ABSTRACT

An electroluminescent device includes an R pixel which emits red light, a G pixel which emits green light, and a B pixel which emits blue light, and an insulator laminated film. In the electroluminescent device, each pixel has, at least, a pair of electrodes of which one is a light transmitting electrode and a light-emitting layer which is inserted between the electrodes, and emits light by being supplied with electric energy. The insulator laminated film is formed on the surface of the light transmitting electrode opposite to the light-emitting layer and has a plurality of low refractive-index layers each formed of a light transmitting insulator and a plurality of high refractive-index layers each formed of a light transmitting insulator having a refractive index higher than that of the low refractive-index layer, which are alternately laminated. Each low refractive-index layer is formed over the entire luminescent region of the R pixel, the G pixel, and the B pixel and has a constant thickness even in any one of regions which overlap the R pixel, the G pixel, and the B pixel. Each high refractive-index layer is formed over the entire luminescent region of the R pixel, the G pixel, and the B pixel and has a constant thickness even in any one of regions which overlap the R pixel, the G pixel, and the B pixel. The plurality of the low refractive-index layers have different thicknesses, and the plurality of the high refractive-index layers have different thicknesses. The thicknesses of the low refractive-index layers and the high refractive-index layers are determined such that, when the light-emitting layer emits light, light having an intensity higher than that of the case of not having the insulator laminated film is emitted from the insulator laminated film by reflection at, at least, the interface between the light transmitting electrode and the insulator laminated film and the interfaces between the low refractive-index layers and the high refractive-index layers, even in a luminescence peak wavelength of any one of the R pixel, the G pixel, and the B pixel.

7 Claims, 17 Drawing Sheets

U.S. PATENT DOCUMENTS

| | | | |
|---|---|---|---|
| 6,724,140 B2 * | 4/2004 | Araki | 313/504 |
| 6,791,261 B1 | 9/2004 | Shimoda et al. | |
| 6,993,214 B2 | 1/2006 | Nishimura et al. | |
| 7,190,354 B2 * | 3/2007 | Tanaka et al. | 345/173 |
| 7,221,003 B2 * | 5/2007 | Ueno et al. | 257/98 |
| 7,233,029 B2 * | 6/2007 | Mochizuki | 257/98 |
| 2001/0000335 A1 * | 4/2001 | Yamada et al. | 438/1 |
| 2002/0080493 A1 * | 6/2002 | Tsai et al. | 359/584 |
| 2005/0012456 A1 * | 1/2005 | Nakatsu et al. | 313/506 |

FOREIGN PATENT DOCUMENTS

| | | |
|---|---|---|
| JP | 2797883 B2 | 7/1998 |
| JP | A 2001-071558 | 3/2001 |
| JP | A-2002-184567 | 6/2002 |
| JP | A-2002-216975 | 8/2002 |
| JP | A-2003-272873 | 9/2003 |
| JP | A 2003-528421 | 9/2003 |
| JP | A-2003-315534 | 11/2003 |
| JP | A 2004-178930 | 6/2004 |
| WO | WO 00/76010 A1 | 12/2000 |

* cited by examiner

FIG. 3

| LAYER NAME | MATERIAL | | REGION OVERLAPPING R PIXEL | REGION OVERLAPPING G PIXEL | REGION OVERLAPPING B PIXEL |
|---|---|---|---|---|---|
| INSULATING LAYER (HIGH REFRACTIVE-INDEX LAYER) 16a | SiNx | THICKNESS | 154 nm | 154 nm | 154 nm |
| | | REFRACTIVE INDEX | 1.87 | 1.887 | 1.9 |
| | | OPTICAL DISTANCE | 287.98 nm | 290.598 nm | 292.6 nm |
| INSULATING LAYER (LOW REFRACTIVE-INDEX LAYER) 17a | SiO2 | THICKNESS | 85 nm | 85 nm | 85 nm |
| | | REFRACTIVE INDEX | 1.48 | 1.485 | 1.49 |
| | | OPTICAL DISTANCE | 125.8 nm | 126.225 nm | 126.65 nm |
| INSULATING LAYER (HIGH REFRACTIVE-INDEX LAYER) 16b | SiNx | THICKNESS | 68 nm | 68 nm | 68 nm |
| | | REFRACTIVE INDEX | 1.87 | 1.887 | 1.9 |
| | | OPTICAL DISTANCE | 127.16 nm | 128.32 nm | 129.2 nm |
| INSULATING LAYER (LOW REFRACTIVE-INDEX LAYER) 17b | SiO2 | THICKNESS | 96 nm | 96 nm | 96 nm |
| | | REFRACTIVE INDEX | 1.48 | 1.485 | 1.49 |
| | | OPTICAL DISTANCE | 142.08 nm | 142.56 nm | 143.04 nm |
| INSULATING LAYER (HIGH REFRACTIVE-INDEX LAYER) 16c | SiNx | THICKNESS | 69 nm | 69 nm | 69 nm |
| | | REFRACTIVE INDEX | 1.87 | 1.887 | 1.9 |
| | | OPTICAL DISTANCE | 129.03 nm | 130.203 nm | 131.1 nm |
| INSULATING LAYER (LOW REFRACTIVE-INDEX LAYER) 17c | SiO2 | THICKNESS | 107 nm | 107 nm | 107 nm |
| | | REFRACTIVE INDEX | 1.48 | 1.485 | 1.49 |
| | | OPTICAL DISTANCE | 158.36 nm | 158.895 nm | 159.43 nm |
| TRANSPARENT ANODE (PIXEL ELECTRODE) 4 | ITO | THICKNESS | 95 nm | 50 nm | 50 nm |
| | | REFRACTIVE INDEX | 1.9 | 2.0 | 2.05 |
| | | OPTICAL DISTANCE | 180.5 nm | 100 nm | 102.5 nm |
| HOLE INJECTION / TRANSPORT LAYER 28 | PEDOT / PSS | THICKNESS | 70 nm | 70 nm | 30 nm |
| | | REFRACTIVE INDEX | 1.45 | 1.457 | 1.465 |
| | | OPTICAL DISTANCE | 101.5 nm | 102 nm | 43.95 nm |
| ELECTRON BLOCKING LAYER (INTERMEDIATE LAYER) 29 | TRIPHENYLAMINE POLYMER | THICKNESS | 8 nm | 8 nm | 8 nm |
| | | REFRACTIVE INDEX | 1.8 | 1.8 | 1.9 |
| | | OPTICAL DISTANCE | 14 nm | 14 nm | 15 nm |
| LIGHT-EMITTING LAYER 7 | | THICKNESS | 96 nm | 90 nm | 70 nm |
| | | REFRACTIVE INDEX | 1.625 | 1.81 | 1.8 |
| | | OPTICAL DISTANCE | 156 nm | 162.9 nm | 126 nm |

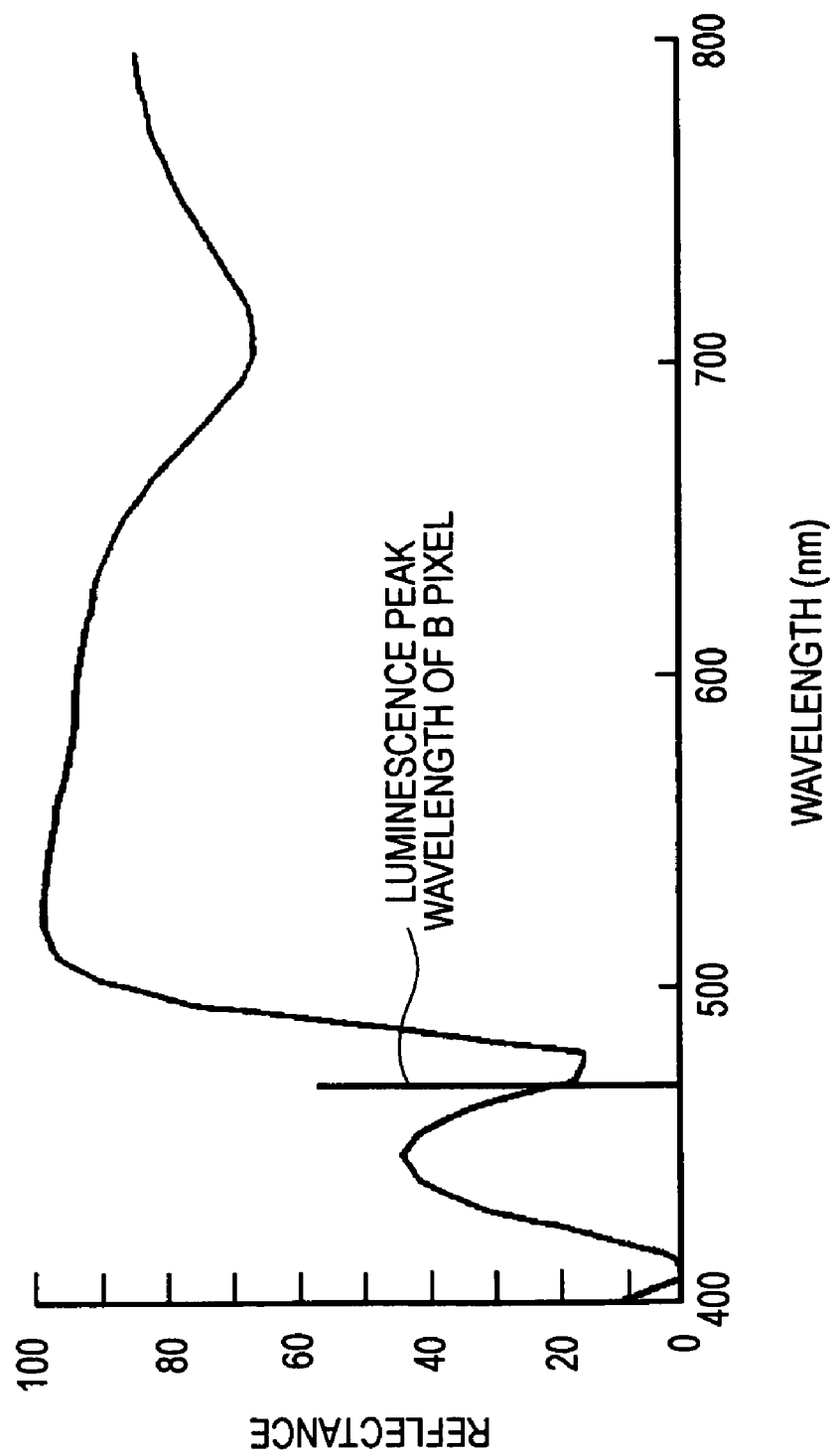

FIG. 13

| LAYER NAME | MATERIAL | TYPE A | | | TYPE B | | | TYPE C | | | TYPE D | | | TYPE E | | |
|---|---|---|---|---|---|---|---|---|---|---|---|---|---|---|---|---|
| | | R | G | B | R | G | B | R | G | B | R | G | B | R | G | B |
| INSULATING LAYER (HIGH REFRACTIVE-INDEX LAYER) 16a | SiNx | 100 | 100 | 100 | 60 | 60 | 60 | 224 | 224 | 224 | 224 | 224 | 224 | 154 | 154 | 154 |
| INSULATING LAYER (LOW REFRACTIVE-INDEX LAYER) 17a | SiO2 | 180 | 180 | 180 | 80 | 80 | 80 | 56 | 56 | 56 | 56 | 56 | 56 | 85 | 85 | 85 |
| INSULATING LAYER (HIGH REFRACTIVE-INDEX LAYER) 16b | SiNx | 80 | 80 | 80 | 80 | 80 | 80 | 40 | 40 | 40 | 40 | 40 | 40 | 68 | 68 | 68 |
| INSULATING LAYER (LOW REFRACTIVE-INDEX LAYER) 17b | SiO2 | 100 | 100 | 100 | 100 | 100 | 100 | 160 | 160 | 160 | 160 | 160 | 160 | 96 | 96 | 96 |
| INSULATING LAYER (HIGH REFRACTIVE-INDEX LAYER) 16c | SiNx | 60 | 60 | 60 | 50 | 50 | 50 | 50 | 50 | 50 | 50 | 50 | 50 | 69 | 69 | 69 |
| INSULATING LAYER (LOW REFRACTIVE-INDEX LAYER) 17c | SiO2 | 70 | 70 | 70 | 60 | 60 | 60 | 76 | 76 | 76 | 76 | 76 | 76 | 107 | 107 | 107 |
| TRANSPARENT ANODE (PIXEL ELECTRODE) 4 | ITO | 50 | 50 | 50 | 60 | 60 | 60 | 50 | 50 | 50 | 100 | 50 | 50 | 95 | 50 | 30 |
| HOLE INJECTION / TRANSPORT LAYER 28 | PEDOT / PSS | 20 | 70 | 70 | 40 | 40 | 40 | 70 | 70 | 40 | 70 | 70 | 40 | 70 | 70 | 30 |
| ELECTRON BLOCKING LAYER (INTERMEDIATE LAYER) 29 | TRIPHENYLAMINE POLYMER | 8 | 8 | 8 | 8 | 8 | 8 | 8 | 8 | 8 | 8 | 8 | 8 | 8 | 8 | 8 |
| LIGHT-EMITTING LAYER 7 | | 70 | 95 | 70 | 100 | 95 | 70 | 100 | 95 | 70 | 100 | 95 | 70 | 96 | 90 | 70 |
| ELECTRON INJECTION LAYER 8 | LiF | 2 | 2 | 2 | 2 | 2 | 2 | 2 | 2 | 2 | 2 | 2 | 2 | 2 | 2 | 2 |
| SECOND COUNTER ELECTRODE LAYER | Ca | 5 | 5 | 5 | 5 | 5 | 5 | 5 | 5 | 5 | 5 | 5 | 5 | 5 | 5 | 5 |
| FIRST COUNTER ELECTRODE LAYER | Al | 200 | 200 | 200 | 200 | 200 | 200 | 200 | 200 | 200 | 200 | 200 | 200 | 200 | 200 | 200 |

FIG. 14

| LAYER NAME | MATERIAL | TYPE F | | | TYPE G | | |
|---|---|---|---|---|---|---|---|
| | | R | G | B | R | G | B |
| INSULATING LAYER (HIGH REFRACTIVE-INDEX LAYER) 16a | SiNx | 176 | 176 | 176 | 90 | 90 | 90 |
| INSULATING LAYER (LOW REFRACTIVE-INDEX LAYER) 17a | SiO2 | 97 | 97 | 97 | 82 | 82 | 82 |
| INSULATING LAYER (HIGH REFRACTIVE-INDEX LAYER) 16b | SiNx | 15 | 15 | 15 | 86 | 86 | 86 |
| INSULATING LAYER (LOW REFRACTIVE-INDEX LAYER) 17b | SiO2 | 88 | 88 | 88 | 76 | 76 | 76 |
| INSULATING LAYER (HIGH REFRACTIVE-INDEX LAYER) 16c | SiNx | 97 | 97 | 97 | 81 | 81 | 81 |
| INSULATING LAYER (LOW REFRACTIVE-INDEX LAYER) 17c | SiO2 | 85 | 85 | 85 | 80 | 80 | 80 |
| INSULATING LAYER (HIGH REFRACTIVE-INDEX LAYER) | SiNx | | | | 75 | 75 | 75 |
| INSULATING LAYER (LOW REFRACTIVE-INDEX LAYER) | SiO2 | | | | 64 | 64 | 64 |
| TRANSPARENT ANODE (PIXEL ELECTRODE) 4 | ITO | 90 | 50 | 50 | 100 | 50 | 50 |
| HOLE INJECTION / TRANSPORT LAYER 28 | PEDOT / PSS | 70 | 70 | 30 | 70 | 70 | 30 |
| ELECTRON BLOCKING LAYER (INTERMEDIATE LAYER) 29 | TRIPHENYLAMINE POLYMER | 8 | 8 | 8 | 8 | 8 | 8 |
| LIGHT-EMITTING LAYER 7 | | 97 | 86 | 70 | 100 | 86 | 70 |
| ELECTRON INJECTION LAYER 8 | LiF | 2 | 2 | 2 | 2 | 2 | 2 |
| SECOND COUNTER ELECTRODE LAYER | Ca | 5 | 5 | 5 | 5 | 5 | 5 |
| FIRST COUNTER ELECTRODE LAYER | Al | 200 | 200 | 200 | 200 | 200 | 200 |

FIG. 15

| LAYER NAME | MATERIAL | TYPE H | | | TYPE I | | | TYPE J | | | TYPE K | | | TYPE L | | |
| --- | --- | --- | --- | --- | --- | --- | --- | --- | --- | --- | --- | --- | --- | --- | --- | --- |
| | | R | G | B | R | G | B | R | G | B | R | G | B | R | G | B |
| INSULATING LAYER (HIGH REFRACTIVE-INDEX LAYER) 16a | SiNx | 176 | 176 | 176 | 176 | 176 | 176 | 158.4 | 158.4 | 158.4 | 123 | 123 | 123 | 110.7 | 110.7 | 110.7 |
| INSULATING LAYER (LOW REFRACTIVE-INDEX LAYER) 17a | SiO2 | 97 | 97 | 97 | 97 | 97 | 97 | 87.3 | 87.3 | 87.3 | 126 | 126 | 126 | 113.4 | 113.4 | 113.4 |
| INSULATING LAYER (HIGH REFRACTIVE-INDEX LAYER) 16b | SiNx | 15 | 15 | 15 | 15 | 15 | 15 | 13.5 | 13.5 | 13.5 | 11 | 11 | 11 | 9.9 | 9.9 | 9.9 |
| INSULATING LAYER (LOW REFRACTIVE-INDEX LAYER) 17b | SiO2 | 88 | 88 | 88 | 88 | 88 | 88 | 79.2 | 79.2 | 79.2 | 114 | 114 | 114 | 102.6 | 102.6 | 102.6 |
| INSULATING LAYER (HIGH REFRACTIVE-INDEX LAYER) 16c | SiNx | 97 | 97 | 97 | 97 | 97 | 97 | 87.3 | 87.3 | 87.3 | 68 | 68 | 68 | 61.2 | 61.2 | 61.2 |
| INSULATING LAYER (LOW REFRACTIVE-INDEX LAYER) 17c | SiO2 | 85 | 85 | 85 | 85 | 85 | 85 | 76.5 | 76.5 | 76.5 | 110 | 110 | 110 | 99 | 99 | 99 |
| TRANSPARENT ANODE (PIXEL ELECTRODE) 4 | ITO | 100 | 100 | 30 | 60 | 60 | 30 | 80 | 80 | 30 | 80 | 80 | 30 | 80 | 80 | 30 |
| HOLE INJECTION / TRANSPORT LAYER 28 | PEDOT / PSS | 50 | 50 | 50 | 60 | 60 | 60 | 60 | 60 | 60 | 60 | 60 | 60 | 60 | 60 | 60 |
| ELECTRON BLOCKING LAYER (INTERMEDIATE LAYER) 29 | TFB | 8 | 8 | 8 | 8 | 8 | 8 | 8 | 8 | 8 | 8 | 8 | 8 | 8 | 8 | 8 |
| LIGHT-EMITTING LAYER 7 | | 100 | 70 | 70 | 100 | 70 | 70 | 100 | 70 | 70 | 100 | 70 | 70 | 100 | 70 | 70 |
| ELECTRON INJECTION LAYER 8 | LiF | 5 | 5 | 5 | 5 | 5 | 5 | 5 | 5 | 5 | 5 | 5 | 5 | 5 | 5 | 5 |
| SECOND COUNTER ELECTRODE LAYER | Ca | 200 | 200 | 200 | 200 | 200 | 200 | 200 | 200 | 200 | 200 | 200 | 200 | 200 | 200 | 200 |
| FIRST COUNTER ELECTRODE LAYER | Al | | | | | | | | | | | | | | | |

ELECTROLUMINESCENT DEVICE AND ELECTRONIC APPARATUS

BACKGROUND

The present invention relates to an electroluminescent device and an electronic apparatus.

Recently, in an electronic apparatus such as a notebook computer, a portable phone, and an electronic organizer, an electroluminescent device having a plurality of electroluminescence (hereinafter, referred to as EL) elements as a unit for displaying information has been suggested. In the EL element, an EL layer (light-emitting layer) is disposed between a pair of counter electrodes.

In a field of an EL device, techniques have been known in which a specific wavelength of light is made to resonate using a multi-layered film formed by alternately laminating layers having different refractive indexes. For example, in Japanese Patent No. 2797883, an EL device is disclosed which includes a semitransparent reflective film formed of a dielectric material on the entire surface of a glass substrate, a spacer formed of $SiO_2$ thereon, a transparent anode formed thereon, a hole injection layer formed thereon, a light-emitting layer formed thereon, and a cathode formed thereon. Although the light-emitting layer is formed of a common material in all pixels and emits white light, by varying a product of optical distances among the transparent anode, the hole injection layer, and the light-emitting layer or by varying a thickness of the spacer made of $SiO_2$, desired output color can be obtained. Accordingly, although the light-emitting layer is formed of the same white luminescence material, the output colors of R (Red), G (Green), and B (Blue) can be obtained.

Furthermore, in JP-T-2003-528421, an EL device is disclosed which includes light-emitting layers which are formed of different materials in R, G, and B pixels, respectively, and a group of semitransparent reflective layers which overlap the light-emitting layers. The group of the semitransparent reflective layers has the same structure with regard to all the light-emitting layers, but includes a semi-reflective layer suitable for resonance of R light, a semi-reflective layer suitable for resonance of G light, and a semi-reflective layer suitable for resonance of B light, in order to improve color purity of the output light. Each of the semi-reflective layers has a plurality of low refractive-index layers (for example, a layer made of $SiO_2$) and a plurality of high refractive-index layers (for example, a layer made of $TiO_2$), which are alternately laminated. In each of the semi-reflective layers, the refractive index n1 and the thickness d1 of the high refractive-index layer and the refractive index n2 and the thickness d2 of the low refractive-index layer are set to satisfy a relationship of Equation 1.

$$n1 \cdot d1 = n2 \cdot d2 = (1/4 + m/2) \cdot \lambda \quad (1)$$

Here, $\lambda$ is a wavelength of the light which reflects and resonates, and m is an integer more than 0. Accordingly, in each of the semi-reflective layers, the low refractive-index layers have the same thicknesses d2 and the high refractive-index layers have the same thickness d1.

However, in the EL device of Japanese Patent No. 2797883, although light of different colors can be output from white light-emitting layers, it is difficult to improve the purity of the output light. In addition, in the wavelength ranges of R, G, and B, the white luminescence material having some luminescence intensity is limited.

In addition, in the EL device of JP-T-2003-528421, actually, for example, red light of R pixel is significantly reflected from layers suitable for green light or blue light. Accordingly, light of any color pixel is significantly attenuated while passing through the group of semi-transparent reflective layers and thus desired resonance effect cannot be obtained. Further, since the light generated in the light-emitting layer reflects from and transmits various interfaces to move in various paths until being output, the excellent effect may not be obtained although the thicknesses of the low refractive-index layers and the high refractive-index layers are determined based on Equation 1. In addition, since the group of semi-transparent reflective layers includes the semi-reflective layer suitable for resonance of R light, the semi-reflective layer suitable for resonance of G light, and the semi-reflective layer suitable for resonance of B light, the number of the layers necessarily increases and thus it is difficult to manufacture the group of semi-transparent reflective layers.

SUMMARY

An advantage of the invention is that it provides an EL device and an electronic apparatus including the EL device which can improve color purity of output light and can be easily manufactured due to a simple structure.

According to an aspect of the invention, an electroluminescent device is provided which includes an R pixel which emits red light, a G pixel which emits green light, a B pixel which emits blue light, and an insulator laminated film. In the electroluminescent device, each pixel has, at least, a pair of electrodes of which one is a light transmitting electrode and a light-emitting layer which is inserted between the electrodes, and emits light by being supplied with electric energy. The insulator laminated film is formed on the surface of the light transmitting electrode opposite to the light-emitting layer and has a plurality of low refractive-index layers each formed of a light transmitting insulator and a plurality of high refractive-index layers each formed of a light transmitting insulator having a refractive index higher than that of the low refractive-index layer, which are alternately laminated. Each low refractive-index layer is formed over the entire luminescent region of the R pixel, the G pixel, and the B pixel and has a constant thickness even in any one of regions which overlap the R pixel, the G pixel, and the B pixel. Each high refractive-index layer is formed over the entire luminescent region of the R pixel, the G pixel, and the B pixel and has a constant thickness even in any one of regions which overlap the R pixel, the G pixel, and the B pixel. The plurality of the low refractive-index layers have different thicknesses, and the plurality of the high refractive-index layers have different thicknesses. The thicknesses of the low refractive-index layers and the high refractive-index layers are determined such that, when the light-emitting layer emits light, light having an intensity higher than that of the case of not having the insulator laminated film is emitted from the insulator laminated film by reflection at, at least, the interface between the light transmitting electrode and the insulator laminated film and the interfaces between the low refractive-index layers and the high refractive-index layers, even in a luminescence peak wavelength of any one of the R pixel, the G pixel, and the B pixel.

In the EL device of this aspect, the insulator laminated film in which the plurality of low refractive-index layers and the plurality of high refractive-index layers are alternately laminated is provided on the surface of the light transmitting electrode opposite to the light-emitting layer. By adequately determining the thicknesses of the low refractive-index layers and the high refractive-index layers, when the light-emitting layer emits light, even in a luminescence peak wavelength of any one of the R pixel, the G pixel, and the B pixel, light having an intensity higher than that of the case of not having the insulator laminated film is emitted from the insulator laminated film by reflection at, at least, the interface between the light transmitting electrode and the insulator laminated film and the interfaces between the low refractive-index layers and the high refractive-index layers. The "luminescence peak wavelength" is a wavelength having a highest intensity among the wavelengths of light emitted from the light-emitting layer of the pixel. In the invention, the light having a high intensity is emitted by the insulator laminated film in the luminescence peak wavelength of the R pixel, the luminescence peak wavelength of the G pixel, and the luminescence peak wavelength of the B pixel. Accordingly, it is possible to improve color purity of output light. The plurality of low refractive-index layers have different thicknesses, but each of the low refractive-index layers has the constant thickness even in any one of the regions which overlap the R pixel, the G pixel, and the B pixel. The plurality of high refractive-index layers have different thicknesses, but each of the high refractive-index layers has the constant thickness even in any one of the regions which overlap the R pixel, the G pixel, and the B pixel. Accordingly, the thickness need not vary depending on the pixel. That is, the insulator laminated film which overlaps the R pixel, the G pixel, and the B pixel has a common structure. Furthermore, it is unnecessary to separately design a layer suitable for resonance of R light, a layer suitable for resonance of G light, and a layer suitable for resonance of B light. Accordingly, the structure of the organic EL device is simple and the manufacturing thereof is easy.

According to another aspect of the invention, an electroluminescent device is provided which includes an R pixel which emits red light, a G pixel which emits green light, a B pixel which emits blue light, and an insulator laminated film. In the electroluminescent device, each pixel has, at least, a pair of electrodes of which one is a light transmitting electrode and a light-emitting layer which is inserted between the electrodes, and emits light by being supplied with electric energy. The insulator laminated film is formed on the surface of the light transmitting electrode opposite to the light-emitting layer. The insulator laminated film has a low refractive-index layer formed of a light transmitting insulator and a high refractive-index layer formed of a light transmitting insulator having a refractive index higher than that of the low refractive-index layer. The low refractive-index layer is formed over the entire luminescent region of the R pixel, the G pixel, and the B pixel and has a constant thickness even in any one of regions which overlap the R pixel, the G pixel, and the B pixel. The high refractive-index layer is formed over the entire luminescent region of the R pixel, the G pixel, and the B pixel and has a constant thickness even in any one of regions which overlap the R pixel, the G pixel, and the B pixel. The thicknesses of the low refractive-index layers and the high refractive-index layers are determined such that, when light is incident from the insulator laminated film toward the light transmitting electrode and the light-emitting layer, the reflectance in a wavelength in ± 20 nm of the luminescence peak wavelength of each of the R pixel, the G pixel, and the B pixel is lower than that in any other wavelengths in ± 50 nm of the luminescence peak wavelength by reflection at at least the interface between the light transmitting electrode and the insulator laminated film and the interface between the low refractive-index layer and the high refractive-index layer.

In the EL device of this aspect, the insulator laminated film having the low refractive-index layer and the high refractive-index layer is provided on the surface of the light transmitting electrode opposite to the light-emitting layer. By adequately determining the thicknesses of the low refractive-index layer and the high refractive-index layer, when light is incident from the light-emitting layer toward the light transmitting electrode and the insulator laminated film, the reflectance in a wavelength in ± 20 nm of the luminescence peak wavelength of each of the R pixel, the G pixel, and the B pixel is lower than that of the other wavelength in ± 50 nm of the luminescence peak wavelength by reflection at at least the interface between the light transmitting electrode and the insulator laminated film and the interface between the low refractive-index layer and the high refractive-index layer. For example, in a range of ± 50 nm of the luminescence peak wavelength of the R pixel, the reflectance in a wavelength in ± 20 nm of the luminescence peak wavelength of the R pixel is the lowest. For this reason, it is possible to improve color purity of output light. In this specification, the "in ± 20 nm" includes a wavelength of +20 nm and a wavelength of −20 nm of the luminescence peak wavelength, and the "in ± 50 nm" includes a wavelength of +50 nm and a wavelength of −50 m of the luminescence peak wavelength. The low refractive-index layer has the constant thickness even in any one of the regions which overlap the R pixel, the G pixel, and the B pixel, and the high refractive-index layer has the constant thickness even in any one of the regions which overlap the R pixel, the G pixel, and the B pixel. Accordingly, it is unnecessary to vary the thickness depending on the pixel. That is, the insulator laminated film which overlaps the R pixel, the G pixel, and the B pixel have a common structure. Furthermore, it is unnecessary to separately design a layer suitable for resonance of R light, a layer suitable for resonance of G light, and a layer suitable for resonance of B light. Accordingly, the structure of the organic EL device is simple and the manufacturing thereof is easy.

A combination of the thicknesses of the layers including the light transmitting electrode and the light-emitting layer from the light transmitting electrode to the light-emitting layer may be different depending on the luminescence color of the pixel. To this end, since the combination of thicknesses of the layers from the light transmitting electrode to the light-emitting layer is different depending on the luminescence color of the pixel while the insulator laminated film which overlaps the R pixel, the G pixel, and the B pixel have the common structure, adequate reflection characteristics can be easily obtained depending on the luminescence color of the pixel.

The EL device may be an organic EL device and an intermediate layer for reducing leakage of holes or electrons from the light-emitting layer toward the light transmitting electrode may be provided between the light-emitting layer and the light transmitting electrode. To this end, the luminescence location in the thickness direction of the light-emitting layer is different from that of the case of not having the intermediate layer. For example, unlike the case of not having intermediate layer (hole blocking layer and electron blocking layers) between the light-emitting layer and the electrodes, in case of providing the intermediate layer between the light-emitting layer and the light transmitting electrode, the luminescence location of the light-emitting layer may be displaced toward not only the intermediate layer but also the light transmitting electrode. Also, the light may be emitted at the interface between the light-emitting layer and the intermediate layer depending on the material and/or the thickness of the intermediate layer. Accordingly, by providing the intermediate layer and selecting the material and/or the thickness thereof, it is possible to adjust not only the luminescence location in the thickness direction of the light-emitting layer, but also the optical distance by which the light propagates from the luminescence location to the insulator laminated film.

The insulator laminated film may have a plurality of low refractive-index layers and a plurality of high refractive-index layers, which are alternately laminated, the plurality of the low refractive-index layers may have different thicknesses, and the plurality of the high refractive-index layers may have different thicknesses.

Conventionally, in the structure in which light is made to resonate in the insulator laminated film in which the plurality of low refractive-index layers and the plurality of high refractive-index layers are alternately laminated, it is general that the low refractive-index layers have the same thickness and the high refractive-index layers have the same thickness based on Equation 1. However, the present inventors found that superior resonance effect cannot be obtained in the conventional structure. Rather, if the plurality of low refractive-index layers have different thicknesses and the plurality of the high refractive-index layers have different thicknesses, it is possible to emit light with high energy although light is made to resonate even in any one of the R pixel, the G pixel, and the B pixel.

Color filters may be provided at the light emitting side of the insulator laminated film. By providing the color filter, it is possible to improve contrast and color purity.

An electronic apparatus according to the invention includes the above-mentioned EL device as a display unit. According to this electronic apparatus, it is possible to realize display with high color purity of output light.

BRIEF DESCRIPTION OF THE DRAWINGS

The invention will be described with reference to the accompanying drawings, wherein like numbers reference like elements.

FIG. 3 is a table illustrating characteristics of each layer of the organic EL device according to the invention;

FIG. 12 is a view illustrating reflectance spectrum of light which is vertically incident from the outside onto the region which overlaps a B pixel in the organic EL device according to the invention;

FIG. 13 is a table illustrating characteristics of each layer of another organic EL device according to the invention;

FIG. 14 is a table illustrating characteristics of each layer of a further organic EL device according to the invention;

FIG. 15 is a table illustrating characteristics of each layer of a still further organic EL device according to the invention;

DETAILED DESCRIPTION OF EMBODIMENTS

Figure 1:
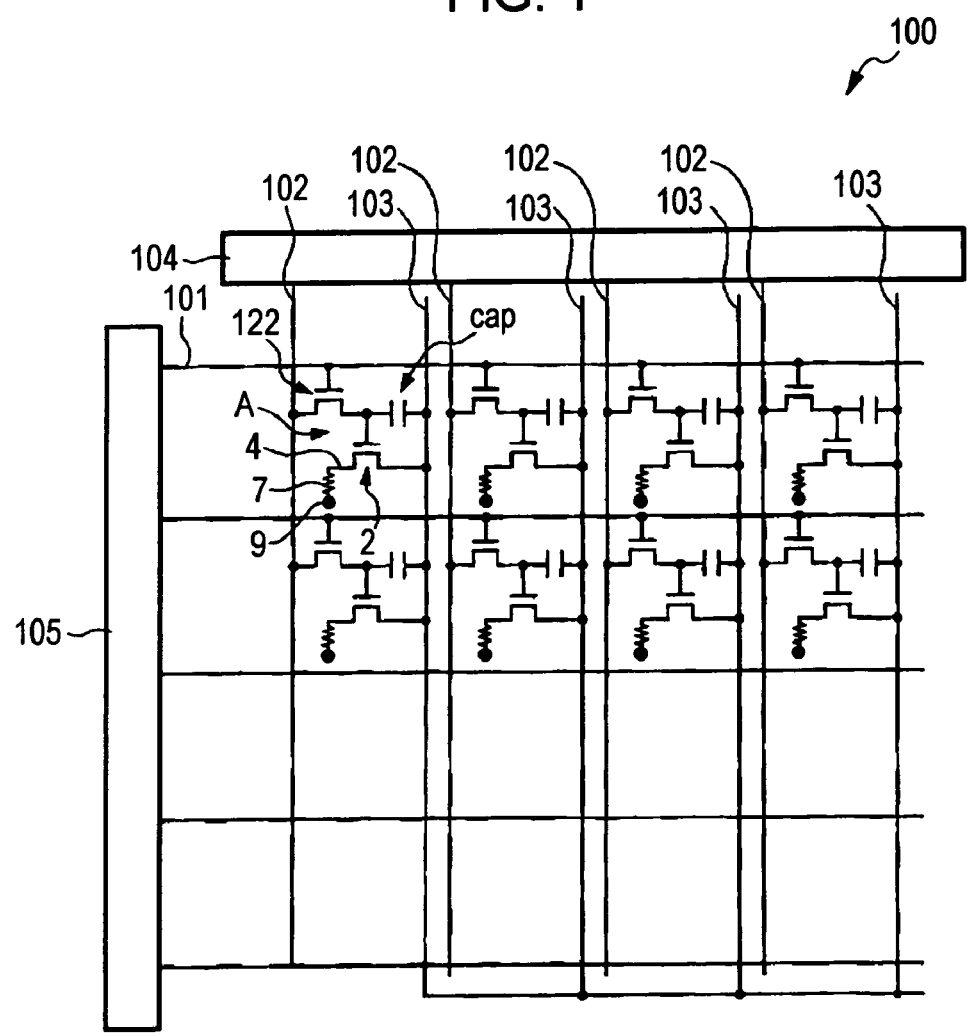
FIG. 1 is a view illustrating a wiring structure of a full-color organic electroluminescence (EL) device according to the invention.

Hereinafter, embodiments of the invention will be described with reference to the accompanying drawings. In the drawings, the ratio of dimensions of layers and members is different from that of actual layers and members.

First Embodiment

Figure 2:
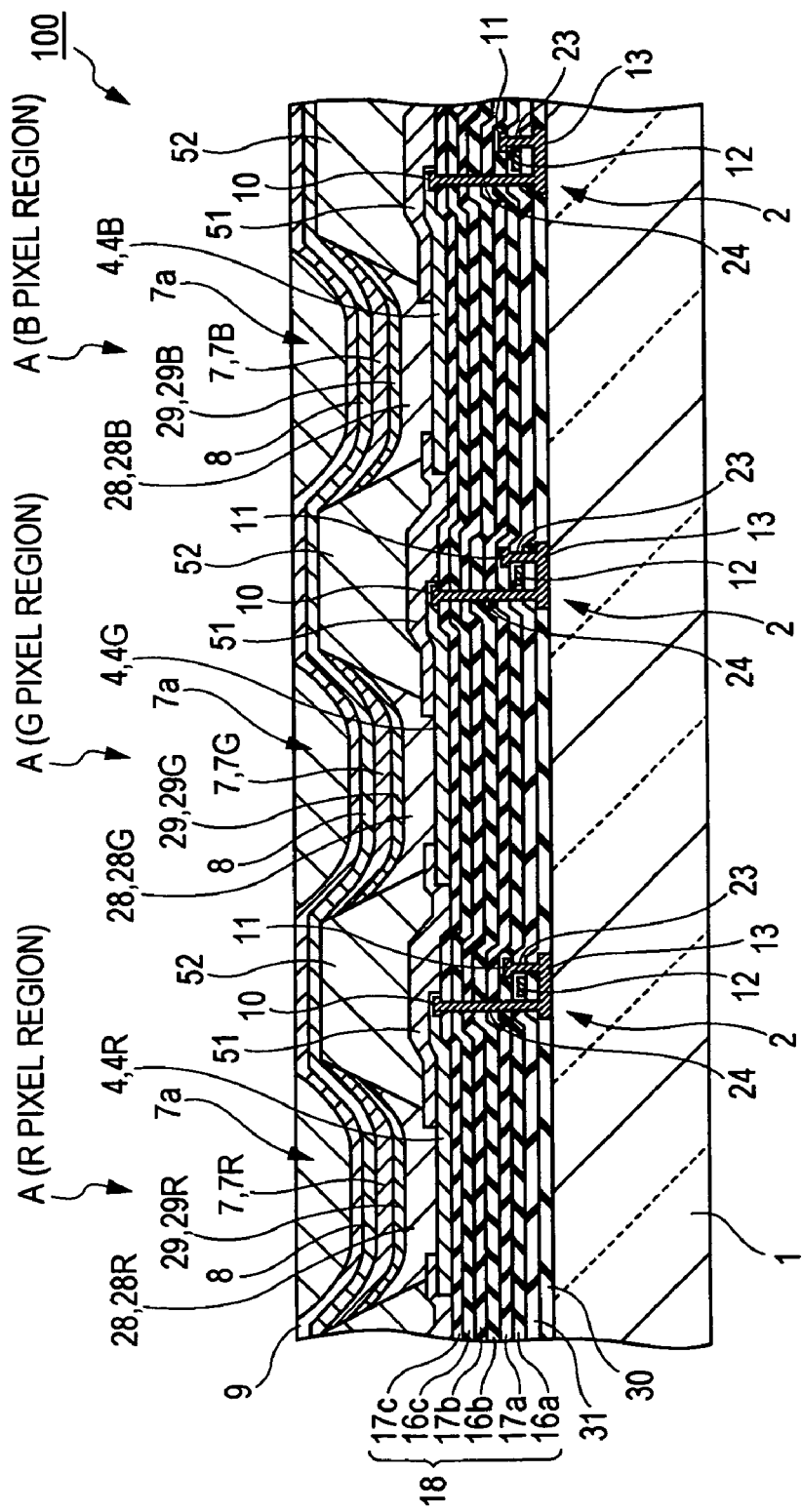
FIG. 2 is a cross-sectional view of the organic EL device shown in FIG. 1.

A full-color organic electroluminescence (EL) device according to a first embodiment of the invention will be described. FIG. 1 illustrates a wiring structure of the organic EL device 100, and FIG. 2 is a cross-sectional view of the organic EL device 100.

As shown in FIG. 1, the organic EL device 100 includes a plurality of scanning lines 101, a plurality of signal lines 102 which extend in a direction crossing the scanning lines 101, and a plurality of power supply lines 103 which extends in parallel to the signal lines 102. Pixel regions A are formed in the vicinities of the intersections of the scanning lines 101 and the signal lines 102 in a matrix.

A data line driving circuit 104 including a shift register, a level shifter, a video line, and an analog switch is connected to the signal lines 102. Furthermore, a scanning line driving circuit 105 including a shift register and a level shifter is connected to the scanning lines 101.

In each pixel region A, there are provided a first thin film transistor 122 of which the gate electrode receives a scan signal through a scanning line 101, a capacitor cap for holding a pixel signal supplied from a signal line 102 through the first thin film transistor 122, and a second thin film transistor 2 of which the gate electrode is provided with the pixel signal held by the capacitor cap. In addition, in the pixel region A, there are provided a pixel electrode (anode) 4 which receives driving current from the power supply line 103 when the power supply line 103 is energized by the second thin film transistor 2 and a light-emitting layer 7 disposed between the pixel electrode 4 and a counter electrode (cathode) 9. The pixel electrode 4, the counter electrode 9, and the light-emitting layer 7 form an organic EL element.

According to this structure, when the scanning line 101 is driven and the first thin film transistor 122 is turned on, the potential of the signal line 102 at this time is held by the capacitor cap, and the ON/OFF state of the second thin film transistor 2 is determined depending on the state of the capacitor cap. Further, current flows from the power supply line 103 to the pixel electrode 4 through the channel of the second thin film transistor 2 and flows in the counter electrode 9 through the light-emitting layer 7. The light-emitting layer 7 emits light depending on the amount of the current flowing therein.

As shown in FIG. 2, the organic EL device 100 includes a transparent substrate 1 formed of a light transmitting material such as glass and a plurality of organic EL elements 7a formed on the transparent substrate 1 in a matrix. Particularly, each organic EL element 7a includes the thin film transistor (TFT) 2 laminated on the transparent substrate 1, the transparent pixel electrode (transparent anode) 4, the light-emitting layer 7, and the counter electrode (cathode) 9.

As the transparent substrate 1, in addition to the glass substrate, various known substrates such as a silicon substrate, a quartz substrate, a ceramic substrate, a metal substrate, a plastic substrate, and a plastic film substrate may be used. On the upper surface of the transparent substrate 1, the plurality of pixel regions A are arranged as luminescent regions in a matrix. Particularly, for color display, the pixel regions corresponding to colors of red (R), green (G), and blue (B) are arranged. In each pixel region A, the pixel electrode 4 is disposed and the signal lines, the power supply lines, and the scanning lines are arranged in the vicinity thereof. In this specification, a pixel region A which can emit light of red (R) is referred to as a R pixel, a pixel region A which can emit light of green (G) is referred to as a G pixel, and a pixel region A which can emit light of blue (B) is referred to as a B pixel.

Furthermore, the plurality of thin film transistors 2 respectively electrically connected to the pixel electrodes (transparent anode) 4 of the pixel regions A are formed on the transparent substrate 1. Each of the thin film transistors 2 includes a semiconductor layer 13 arranged on the transparent substrate 1 in an island shape, a gate electrode 12 which overlaps the drain region of the semiconductor layer 13 and is spaced apart from the semiconductor layer 13, a gate electrode 12 connected to a gate region of one end of the semiconductor layer 13, and a source electrode 11 connected to a source region of the other end of the semiconductor layer 13. The semiconductor layer 13 is formed of, for example, polycrystalline silicon film and the electrodes 10, 11, and 12 are formed of, for example, aluminum. As in the related art, by providing a gate insulating layer 30, a first interlayer insulating layer 31, and second interlayer insulating layers 16a to 16c and 17a to 17c, the semiconductor layer 13 and the electrodes 10, 11, and 12 are disposed at different heights. Particularly, the semiconductor layer 13 is covered by the gate insulating layer 30, the gate electrode 12 disposed on the gate insulating layer 30 is covered by the first interlayer insulating layer 31, the source electrode 11 disposed on the first interlayer insulating 31 is covered by the second interlayer insulating layer 16a, and the drain electrode 10 is disposed on the second interlayer insulating layer 17c.

Although not shown, as in the related art, a gate line connected to the gate electrode 12 is disposed between the insulating layers 30 and 31, a source line connected to the source electrode 11 is disposed between the insulating layers 31 and 16a, and various lines shown in FIG. 1 are disposed between any adjacent layers of the insulating layers 30, 31, 16a to 16c, and 17a to 17c. Contact holes 23 for electrically connecting the source electrode 11 with the source region of the semiconductor layer 13 are formed in the insulating layers 30 and 31. Contact holes 24 for electrically connecting the drain electrode 10 with the drain region of the semiconductor layer 13 are formed in the insulating layers 30, 31, and 16a to 17c.

An insulator laminated film 18 has a plurality of low refractive-index layers each composed of a light-transmissive insulator and a plurality of high refractive-index layers each composed of a light-transmissive insulator, which are alternately laminated. The second interlayer insulating layers 16a to 16c are the high refractive-index layers and are formed of, for example, $SiN_x$ or $TiO_2$. The second interlayer insulating layers 17a to 17c are the low refractive-index layers and are formed of, for example, $SiO_2$. Each of the second interlayer insulating layers 16a to 16c and 17a to 17c have a constant thickness over the entire upper surface of the transparent substrate 1, extend over the luminescent region of the R pixel, the G pixel, and the B pixel, and have the constant thickness even in any region overlaps the R pixel, the G pixel, and the B pixel. As described above, the plurality of second interlayer insulating layers 16a to 16c have different thicknesses and the plurality of the second interlayer insulating layers 17a to 17c have different thicknesses.

The gate insulating layer 30 and the first interlayer insulating layer 31 are formed of, for example, $SiO_2$. Each of the gate insulating layer 30 and the first interlayer insulating layer 31 is a factor defining the characteristics of the TFT 2.

The pixel electrode 4 of each pixel region A is formed on the second interlayer insulating layer 17c which is the uppermost layer of the insulator laminating layer 18 and electrically connected to the drain electrode 10 of the corresponding TFT 2. The pixel electrode 4 is formed of, for example, a light-transmissive conductive material such as indium-tin-oxide (ITO). A hole injection/transport layer 28 is formed on each pixel electrode 4, an intermediate layer 29 is formed on the hole injection/transport layer 28, and the light-emitting layers is formed on the intermediate layer 29. Furthermore, an electron injection layer 8 is formed on every light-emitting layers 7 and a counter electrode 9 is formed thereon. That is, the electron injection layer 8 and the counter electrode 9 are common to every pixel and extend over the entire luminescent regions of the R pixels, the G pixels, and the B pixels. To this end, the pixel electrode 4 faces the counter electrode 9 with the light-emitting layer 7 interposed therebetween and forms the organic EL element (luminescence element) 7a together with the light-emitting layer 7 and the counter electrode 9.

The hole injection/transport layer 28, the intermediate layer 29, and the light-emitting layer 7 are formed in a concave portion defined by bank portions (partition wall portion) 51 and 52. The first bank portion 51 is formed of an inorganic material such as $SiO_2$, and the second bank portion 52 is formed of an organic material such as acryl or polyimide or inorganic material such as $SiO_2$. The first bank portion 51 is formed on the second interlayer insulating layer 17c, covers a portion of an outer edge of the pixel electrode 4, and has therein an opening for arranging the light-emitting layer 7 and so on. In addition, the second bank portion 52 is disposed on the first bank portion 51 and has an opening having a diameter larger than that of the opening of the first bank portion 51.

The hole injection/transport layer 28 is arranged in each pixel region A and formed of the same material in every pixel, for example, a mixture (hereinafter, referred to as PEDOT/PSS) of 3,4-polyethylenedioxythiophen (PEDOT) and polystyrene sulfonic acid (PSS). The intermediate layer 29 also is arranged in each pixel region A and formed of the same material in every pixel. This intermediate layer 29 is an electron blocking layer for blocking electrons which come from the cathode from being leaked from the light-emitting layer 7 toward the pixel electrode (anode) 4 and is formed of a material having good hole injection capability, such as triphenylamine polymer or TFB(poly(2,7-(9,9-di-n-octylfluorene)-(1,4-phenylene-(4-secbutylphenyl)imino)-1,4-phenylene)).

The light-emitting layer 7 includes a red light-emitting layer 7R for emitting red light, a green light-emitting layer 7G for emitting green light, and a blue light-emitting layer 7B for emitting blue light by the current flowing between the electrodes 4 and 9. The light-emitting layers 7 are formed of different organic EL materials for the respective colors.

As described above, the electron injection layer 8 and the counter electrode 9 are common to all pixels. The electron injection layer 8 is formed of, for example, LiF and has the same thickness in the R pixel, the G pixel, and the B pixel. Although not shown in detail, the counter electrode (cathode) 9 is, for example, composed of a calcium layer and an aluminum layer. One layer of the counter electrode which is close to the electron injection layer 8 is a very thin second counter electrode layer made of calcium and the other layer of the counter electrode which is far apart from the electron injection layer 8 is a thicker first counter electrode layer made of aluminum. Each of the first counter electrode layer and the second counter electrode layer has the constant thickness in the regions which overlap the R pixel, the G pixel, and the B pixel.

Although the structure of the luminescence element according to this embodiment is the same as described above, the invention may use a type having no the electron injection layer 8 or a type in which the electron transport layer is provided between the electron injection layer 8 and the light-emitting layer 7, as a variation of the luminescence element which can be used in the invention. For example, in the case of using a low molecular light-emitting layer 7, a type having a cathode, an electron injection layer, an electron transport layer, a light-emitting layer, a hole transport layer, a hole injection layer, and an anode is generally used. In the case of a high molecular light-emitting layer 7, a type having a cathode, a light-emitting layer, a hole injection layer, and an anode is widely used. The invention may use these types.

In addition, although, in this embodiment, the anode is transparent, the cathode is reflective, and light from the light-emitting layer 7 is emitted to the outside through the transparent anode 4 and the insulator laminated film 18, the invention may be used in a type in which the anode is reflective, a cathode is transparent, and the insulator laminated film 18 is disposed on the side of the transparent cathode, such that the light from the light-emitting layer 7 is emitted outward through the transparent cathode and the insulator laminated film. In addition, although the organic EL device 100 according to this embodiment is a bottom emission type in which the light from the light-emitting layer 7 is emitted outward through the substrate 1, the invention may use a top emission type in which the light from the light-emitting layer 7 is emitted to the side opposite to the substrate.

As described above, the intermediate layer 29 is the electron blocking layer. Unlike a case of no intermediate layer 29, if the intermediate layer 29 is provided, it is possible that the light is displaced in the light-emitting layer toward the intermediate layer 29 and the pixel electrode (transparent anode) 4 in the thickness direction of the light-emitting layer and is emitted from the interface between the light-emitting layer 7 and the intermediate layer 29 in accordance with electron block performance determined by the material and/or the thickness of the intermediate layer 29. In this embodiment, the intermediate layer 29 is disposed between the light-emitting layer 7 and the transparent anode 4 as the electron blocking layer. However, in the type that the anode is reflective and the cathode is transparent, the intermediate layer is disposed between the light-emitting layer and the transparent cathode as a hole blocking layer. The hole blocking layer blocks the holes which come from the anode from being leaked from the light-emitting layer 7 toward the counter electrode (cathode) 9. If the hole blocking layer is provided, it is possible that the light is displaced toward the hole blocking layer and the cathode in the thickness direction of the light-emitting layer and is emitted from the interface between the light-emitting layer and the hole blocking layer in accordance with hole block performance determined by the material and/or the thickness of the hole blocking layer. If the intermediate layers are provided on the both sides of the light-emitting layer 7, that is, if the hole blocking layer and the electron blocking layer are provided, the luminescent location in the thickness direction of the light-emitting layer is closer to any one of the hole blocking layer and the electron blocking layer, which has better blocking performance. Accordingly, by providing at least one intermediate layer and selecting the material and/or the thickness thereof, the luminescent location in the thickness direction of the light-emitting layer and the optical distance of light which propagates from the luminescent location to the insulator laminated film can be adjusted.

FIG. 3 is a table illustrating characteristics of each layer of the organic EL device 100 according to this embodiment. In FIG. 3, the refractive index is different even in the same material according to the luminescence color of the pixel because the refractive index has wavelength dependency. When the R pixel emits the light of 620 nm, the G pixel emits the light of 540 nm, and the B pixel emits the light of 470 nm, the refractive index shown in FIG. 3 is obtained. The optical distance of each layer of FIG. 3 is a product of the thickness of the layer and the refractive index. As shown in FIG. 3, each of the second interlayer insulating layers 16a to 16c and 17a to 17c in the insulator laminated film 18 has the constant thickness even in any region that overlaps the R pixel, the G pixel, and the B pixel. In addition, the plurality of the second interlayer insulating layers 16a to 16c have different thicknesses and the plurality of the second interlayer insulating layers 17a to 17c have different thicknesses.

Although the insulator laminated film 18 has the same structure and thickness in every pixel, a combination of the layers from the pixel electrode 4 to the light-emitting layer 7 (including the pixel electrode 4 and the light-emitting layer 7) is different depending on the luminescence color of the pixel. In the region which overlaps the R pixel, the thickness of the pixel electrode 4 is 95 nm, and, in the regions which overlap the G pixel and the B pixel, the thickness of the pixel electrode 4 is 50 nm. In the regions which overlap the R pixel and the G pixel, the thickness of the hole injection/transport layer 28 is 70 nm, and, in the region which overlaps the B pixel, the thickness of the hole injection/transport layer 28 is 30 nm. The thickness of the light-emitting layer 7 is different depending on the luminescence color of the pixel.

Figure 4:
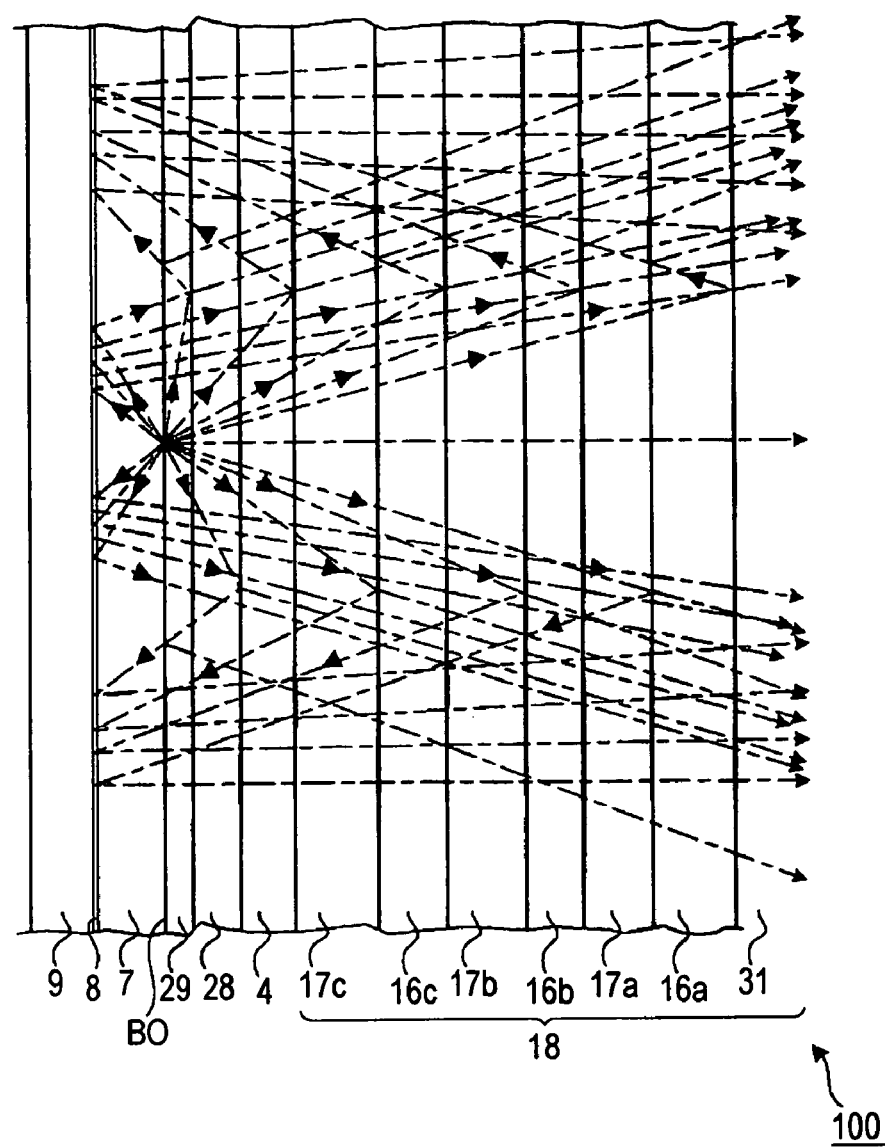
FIG. 4 is a view schematically illustrating an example of the path of light emitted from a pixel in the organic EL device according to the invention.

FIG. 4 schematically illustrates an example of the path of light emitted from a pixel in the organic EL device 100 according to this embodiment of the invention. In FIG. 4, solid lines represent the interface between the layers and dashed dot lines represent light paths. The shown light paths are representative examples. Although other light paths may exist, they are not shown in FIG. 4 for clarity. In addition, the angles of the dashed dot lines do not exactly represent the propagation angles of the light, and are shown so as to easily distinguish the plurality of paths.

FIG. 4 shows the example when it is assumed that the interface BO between the light-emitting layer 7 and the intermediate layer 29 emits the light. Although the light is emitted from the luminescent location toward all directions, the light which is not absorbed to the counter electrode 9 is reflected from the interface between the reflective counter electrode 9 and the electron injection layer 8 in the right direction of FIG. 4. Furthermore, reflection and refraction occurs in the interface between two layers which transmit the light. That is, a portion of the light is reflected from the interface and the other portion is refracted and propagates. In addition, when the light propagates from a material having a high refractive index (for example, the second interlayer insulating layers 16a to 16c) to a material having a low refractive index (for example, the second interlayer insulating layers 17a to 17c), if the incident angle exceeds any angle (critical angle), a phenomenon that the light is reflected at the interface, that is, total-reflection occurs. Even when the light propagates from the material having a high refractive index to the material having a low refractive index, if the incident angle is smaller than the critical angle (in a case of substantially vertical incidence, only a portion of the light is reflected at the interface and the other portion thereof is refracted and propagates.

By the above-described structure, if the light-emitting layer 7 emits the light, resonance occurs by the reflection at the interface between the intermediate layer 29 and the hole injection/transport layer 28, the interface between the hole injection/transport layer 28 and the pixel electrode 4, the interface between the pixel electrode 4 and the insulator laminated film 18, and the interfaces between the second interlayer insulating layers 17a to 17c having the low refractive index and the second interlayer insulating layer 16a to 16c having the high refractive index. Even in a luminescence peak wavelength of any one of the R pixel, the G pixel, and the B pixel, the light having an intensity higher than that of the case of not having the insulator laminated film 18 is emitted from the insulator laminated film 18 outward (toward the opposite side of the insulator laminated film 18 to the light-emitting layer 7, that is, the side of the transparent substrate 1). The "luminescence peak wavelength" is a wavelength having a largest intensity among the wavelengths of the light emitted from the light-emitting layer 7 of the pixel. In the invention, the light having a high intensity is emitted by the insulator laminated film 18, even in the luminescence peak wavelength (620 nm) of the R pixel, the luminescence peak wavelength (540 nm) of the G pixel, and the luminescence peak wavelength (470 nm) of the B pixel. Accordingly, it is possible to improve the color purity of the output light.

In other words, in this embodiment, the thicknesses of the high refractive-index layer (the second interlayer insulating layers 16a, 16b, and 16c) and the low refractive-index layer (the second interlayer insulating layers 17a, 17b, and 17c) are determined such that the light having an intensity higher than that of the case of not having the insulator laminated film 18 is emitted outward from the insulator laminated film by the reflection at the interfaces even in any luminescence peak wavelength of the R pixel, the G pixel, and the B pixel, when the light-emitting layer 7 emits the light. Hereinafter, the procedure of determining the thicknesses of these layers will be described.

First, the premise of the procedure of determining the thicknesses of the layers to be explained will be described. A reflectance R, a transmittance T at the interface between two layers upon the vertical incidence, a phase variation $\phi r$ upon the reflection, and a phase variation $\phi t$ upon the transmission are obtained by the following Equations 2 to 5. Here, $n_1$ is the refractive index of the incident side of a medium, $n_2$ is the refractive index of the emitting side of the medium, and $k_2$ is an optical quenching factor of the emitting side of the medium. The refractive index and the optical quenching factor depend on the wavelength of the light.

$$R=\{(n_1-n_2)^2+k_2^2\}/\{(n_1+n_2)^2+k_2^2\} \quad (2)$$

$$T=4n_1n_2/\{(n_1+n_2)^2+k_2^2\} \quad (3)$$

$$\phi r=\tan^{-1}\{2n_1k_2/(n_1^2-n_2^2-k_2^2)\} \quad (4)$$

$$\phi t=\tan^{-1}\{k_2/(n_1+n_2)\} \quad (5)$$

The intensity (amplitude) and the phase of the reflected light and the intensity (amplitude) and the phase of the transmitted light at each interface upon the vertical incidence are obtained by using the thickness of each layer and Equations 2 to 5 and the intensity (or amplitude) of the total light (output light) emitted outward from the insulator laminated film 18 is estimated. Further, an optimal thickness of each layer is obtained by repeatedly estimating the intensity (or the amplitude) of the luminescence peak wavelength of the total light emitted outward from the insulator laminated film 18 while varying the thickness of each layer. The light which is emitted and reflected up to three times is summed up in the estimation of the intensity. This is because the light which is reflected more than three times is significantly attenuated by absorption of the light into the layer.

As a condition, the thicknesses of the pixel electrode 4, the hole injection/transport layer 28, and the light-emitting layer 7 is made to vary in a range of actual thickness. Particularly, under the assumption that ITO is used as the material of the pixel electrode 4, the range of the thickness thereof is made to be limited to 40 nm to 100 nm. Further, under the assumption that PEDOT/PSS is used in the material of the hole injection/transport layer 28, the range of the thickness thereof is made to limited to 20 nm to 100 nm. Furthermore, the range of the thickness of the light-emitting layer 7 is made to be limited to 60 nm to 100 nm. In addition, it is assumed that the light is emitted from the interface BO between the light-emitting layer 7 and the intermediate layer 29 (see FIG. 4).

The intensity of the total light emitted outward in the luminescence peak wavelength is estimated by simulation using software. Particularly, the software having a product name "OPTAS-FILM" which is available from Cybernet Systems Co., Ltd., Tokyo, Japan, in August, 2005 is used.

Step 1

Although the intensity of the total light emitted outward in the luminescence peak wavelength must be finally as large as possible even in any of the regions which overlap the R pixel, the G pixel, and the B pixel, in order to equalize the thicknesses of the high refractive-index layer (second interlayer insulating layers 16a, 16b, and 16c) and the low refractive-index layer (second interlayer insulating layers 17a, 17b, and 17c) of the insulator laminated film 18 in every regions, the thicknesses of the high refractive-index layer 16a, the low refractive-index layer 17a, the high refractive-index layer 16b, the low refractive-index layer 17b, the high refractive-index layer 16c, the low refractive-index layer 17c, the pixel electrode 4G, the hole injection/transport layer 28G, the intermediate layer 29G, and the light-emitting layer 7G are made to be optimized in the region which overlaps the G pixel having the luminescence peak wavelength of about 540 nm which is substantially a center wavelength of a visible ray region. Particularly, the intensity of the total light emitted outward from the insulator laminated film 18 in the luminescence peak wavelength is repeatedly estimated while varying the thickness of each layer, the thickness combination by which light having a highest intensity in the luminescence peak wavelength is emitted is selected as a combination of an optimal thickness. Since a refractive index and an optical quenching factor depend on the wavelength of light, in this step, optical constants (refractive index and optical quenching factor) of the green wavelength 540 nm are used. In this way, the thickness of each layer of the region which overlaps the G pixel can be obtained and the result is the same as shown in FIG. 3.

Step 2

Next, in the region which overlaps the R pixel (luminescence peak wavelength is about 620 nm), the thicknesses of the high refractive-index layers 16a, 16b, and 16c and the low refractive-index layers 17a, 17b, and 17c are made to be fixed to the values obtained in the step 1, and the thicknesses of the pixel electrode 4R, the hole injection/transport layer 28R, the intermediate layer 29R, and the light-emitting layer 7R are made to be optimized. Particularly, the intensity of the total light emitted outward from the insulator laminated film 18 in the luminescence peak wavelength is repeatedly estimated while varying the thicknesses of the pixel electrode 4R, the hole injection/transport layer 28R, the intermediate layer 29R, and the light-emitting layer 7R under the condition that the thicknesses of the high refractive-index layers 16a, 16b, and 16c and the low refractive-index layers 17a, 17b, and 17c are defined, and the thickness combination by which the light having the highest intensity in the luminescence peak wavelength is emitted is selected as an optimal thickness combination. In this step, the optical constants (refractive index and optical quenching factor) of the red wavelength (620 nm) are used. In this way, the thickness of each layer of the region which overlaps the R pixel can be obtained and the result is the same as shown in FIG. 3.

Step 3

Next, in the region which overlaps the B pixel (luminescence peak wavelength is about 470 nm), the thicknesses of the high refractive-index layers 16a, 16b, and 16c and the low refractive-index layers 17a, 17b, and 17c are made to be fixed to the values obtained in the step 1, and the thicknesses of the pixel electrode 4B, the hole injection/transport layer 28B, the intermediate layer 29B, and the light-emitting layer 7B are made to be optimized. Particularly, the intensity of the total light emitted outward from the insulator laminated film 18 in the luminescence peak wavelength is repeatedly estimated while varying the thicknesses of the pixel electrode 4B, the hole injection/transport layer 28B, the intermediate layer 29B, and the light-emitting layer 7B under the condition that the thicknesses of the high refractive-index layers 16a, 16b, and 16c and the low refractive-index layers 17a, 17b, and 17c are defined, and the thickness combination by which light having highest intensity in the luminescence peak wavelength is emitted is selected as an optimal thickness combination. In this step, the optical constants (refractive index and optical quenching factor) of the blue wavelength (470 nm) are used. In this way, the thickness of each layer of the region which overlaps the B pixel can be obtained and the result is the same as shown in FIG. 3.

As described above, in the region which overlaps the G pixel, the thicknesses of the layers including the thicknesses of the high refractive-index layers 16a, 16b, and 16c and the low refractive-index layers 17a, 17b, and 17c of the insulator laminated film 18 are determined and then, in the region which overlaps the other pixel, the thicknesses of these layers of the insulator laminated film 18 are fixed and the thickness of the other layer is determined. However, in the step (step 1) of optimizing the high refractive-index layers 16a, 16b, and 16c and the low refractive-index layers 17a, 17b, and 17c, the region which overlaps any one of the R pixel, the G pixel, and the B pixel may be used as a reference for determining the thickness. However, if the region which overlaps the G pixel which is nearly the center wavelength of the visible ray is the reference like this embodiment, even in any one of the regions which overlap the R pixel, the G pixel, and the B pixel, the thicknesses of the pixel electrode 4, the hole injection/transport layer 28, the intermediate layer 29, and the light-emitting layer 7 are easily determined such that the light having the high intensity is emitted outward.

Figure 5:
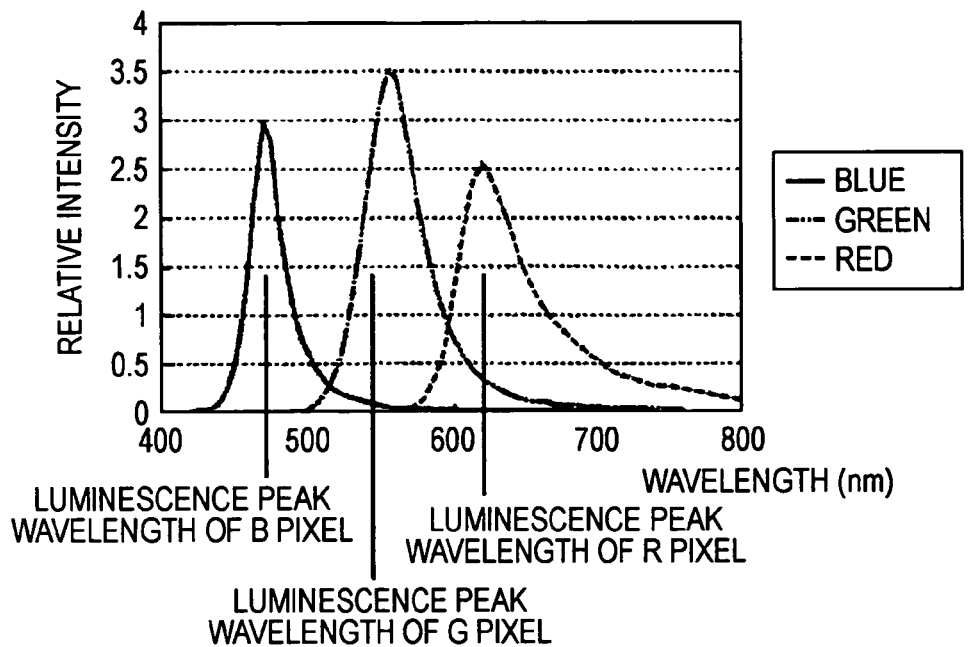
FIG. 5 is a graph illustrating a spectrum of light emitted from a region which overlaps each pixel of the organic EL device according to the invention.
Figure 6:
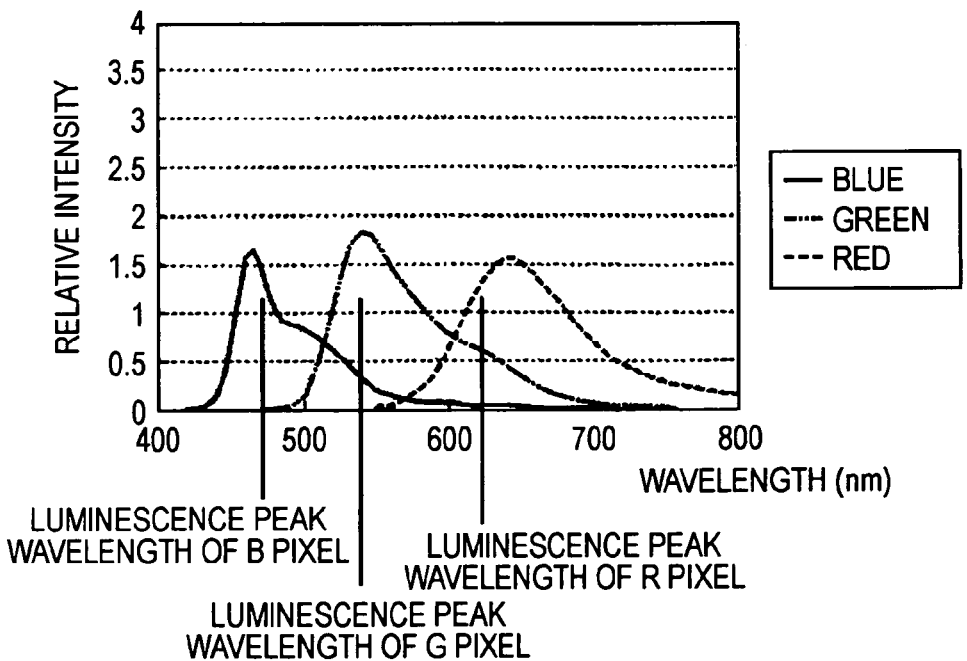
FIG. 6 is a graph illustrating a spectrum of light emitted from a region which overlaps each pixel of an organic EL device according to a comparative example.

FIG. 5 is a graph illustrating a spectrum of light emitted from a region which overlaps each pixel of the organic EL device 100 according to this embodiment through the transparent substrate 1. FIG. 6 is a graph illustrating a spectrum of light emitted from a region which overlaps each pixel of an organic EL device according to a comparative example through a transparent substrate. In these drawings, the curves represented by red, green, and blue represent the spectrums of the light emitted from the regions which overlap the R pixel, the G pixel, and the B pixel. Although not shown, the organic EL device of the comparative example has a transparent substrate made of glass, a single interlayer insulating layer made of $SiN_x$ having a thickness of 600 nm formed thereon, and organic EL elements of R, G, and B formed thereon. Each of the organic EL elements of the comparative example has a pixel electrode (transparent anode) formed on the interlayer insulating layer, made of ITO, and having a thickness of 50 nm, a hole injection/transport layer formed thereon and made of PEDOT/PSS, an intermediate layer (electron blocking layer) formed thereon, a light-emitting layer formed thereon, and a cathode formed thereon and made of reflective metal. In any color organic EL element, the thicknesses of the pixel electrode, the hole injection/transport layer, the intermediate layer, and the light-emitting layer are constant.

In FIG. 5, the relative intensity is a maximum intensity in the spectrum of the light emitted from the regions which overlap the R pixel, the G pixel, and the B pixel of the organic EL device which has the same conditions as this embodiment except for having no insulator laminated film 18, and is obtained by dividing the intensity of the light emitted from the organic EL device 100 of this embodiment. In FIG. 6, the relative intensity is a maximum intensity in the spectrum of the light emitted from the regions which overlap the R pixel, the G pixel, and the B pixel of the organic EL device which has the same conditions as the comparative example except for having no insulator laminated film, and is obtained by dividing the intensity of the light emitted from the organic EL device 100 of the comparative example. As can be apparently seen from FIGS. 5 and 6, according to this embodiment, the intensity of each color light is larger and the spectrum half bandwidth is narrow, as compared to the organic EL device of the comparative example, that is, the organic EL device according to the related art. Accordingly, according to this embodiment, it is possible to improve the color purity of the output light.

As described above, according to this embodiment, even in the luminescence peak wavelength of the R pixel, the luminescence peak wavelength of the G pixel, and the luminescence peak wavelength of the B pixel, the light having a high intensity is emitted by the insulator laminated film 18. Accordingly, it is possible to improve the color purity of the output light. The plurality of the low refractive-index layers 17a, 17b, and 17c of the insulator laminated film 18 have different thicknesses, but each of the low refractive-index layers 17a, 17b, and 17c has the constant thickness even in any one of the regions which overlap the R pixel, the G pixel, and the B pixel. The plurality of the high refractive-index layers 16a, 16b, and 16c have different thicknesses, but each of the high refractive-index layers 16a, 16b, and 16c has the constant thickness even in any one of the regions which overlap the R pixel, the G pixel, and the B pixel. Accordingly, it is unnecessary to vary the thickness depending to the pixel. That is, the parts of the insulator laminated film 18 which overlap the R pixel, the G pixel, and the B pixel have a common structure. Furthermore, it is unnecessary to separately design a layer suitable for resonance of R light, a layer suitable for resonance of G light, and a layer suitable for resonance of B light. Accordingly, the structure of the organic EL device 100 is simple and the manufacturing thereof is easy.

Conventionally, in the structure in which the light resonates in the insulator laminated film in which the plurality of low refractive-index layers and the plurality of high refractive-index layers are alternately laminated, it is general that the low refractive-index layers have the same thickness and the high refractive-index layers have the same thickness on the basis of Equation 1. However, the present inventor found that superior resonance effect couldn't be obtained by this structure. Rather, as in the present embodiment, if the plurality of low refractive-index layers 17a, 17b, and 17c have the different thicknesses and the plurality of the high refractive-index layers 16a, 16b, and 16c have the different thicknesses, as in the present embodiment, it is possible to emit the light with a high intensity by resonating the light of any one of R, G, and B.

Furthermore, according to this embodiment, since a combination of the thicknesses of the layers (including the pixel electrode 4 and the light-emitting layer 7) from the pixel electrode (light transmitting electrode) 4 to the light-emitting layer 7 is different depending on the luminescence color of the pixel, adequate reflection characteristics can be easily obtained according to the luminescence color, while the parts of the insulator laminated film 18 which overlap the R pixel, the G pixel, and the B pixel have the common structure. It is mostly difficult to form a thin film having different thickness depending on the region, and the manufacturing process also is complex. Particularly, in the case of using the high molecular light-emitting layer 7, since the hole injection/transport layer 28 and the light-emitting layer 7 can be formed using a method of dropping a liquid material such as an inkjet method, the thicknesses of the hole injection/transport layer 28 and the light-emitting layer 7 can be easily controlled by adequately adjusting the drop amount of the liquid material.

In this embodiment, the intermediate layer 29 is provided between the light-emitting layer 7 and the hole injection/transport layer 28 as the electron blocking layer, and the intensity of the output light is estimated in the condition that the light is emitted from the interface BO (see FIG. 4) between the light-emitting layer 7 and the intermediate layer 29. However, the intermediate layer may not be provided. If the intermediate layer 29 does not exist, the light is emitted at the balance location of the electron and the hole determined by the characteristics of the hole injection/transport layer 28, the light-emitting layer 7, and the electron injection layer 8. For example, when the intermediate layer does not exist, PEDOT/PSS is used as the material of the hole injection/transport layer 28, and LiF is used as the material of the electron injection layer 8, the light is emitted in the light-emitting layer 7, not at the interface BO, in each pixel. In the R pixel, the luminescent location is about 30 nm from the interface BO. In the G pixel, the luminescent location is about 40 nm from the interface BO. In the B pixel, the luminescent location is about 30 nm from the interface BO. If the intermediate does not exist, the intensity of the output light can be calculated using the luminescent locations based on the above-described method, using the luminescent locations.

Next, an example of a method of fabricating the organic EL device will be described.

Figure 7A:
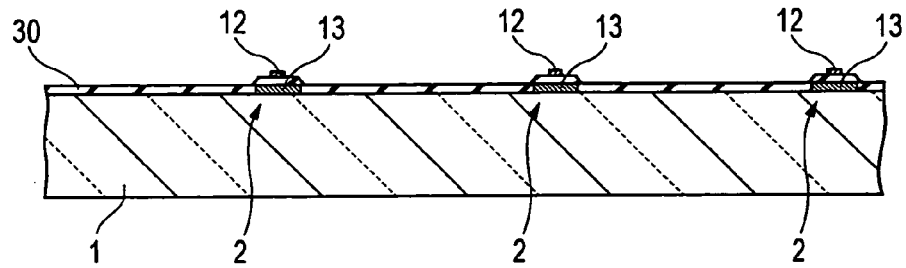
FIG. 7A is a cross-sectional view illustrating a process of manufacturing the organic EL device according to the invention.

First, as shown in FIG. 7A, a semiconductor layer 13 having an island shape is formed on a transparent substrate 1 which is prepared in advance. Here, a polycrystalline silicon film is formed in each pixel region A (see FIG. 2) by a photolithographic method in a one-to-one correspondence with the semiconductor layer 13.

Next, a gate insulating layer 30 is formed on the transparent substrate 1 so as to cover the semiconductor layer 13. Particularly, the gate insulating layer is formed of $SiO_2$ with a film thickness of 75 nm by a CVD method or the other deposition method. Further, a gate electrode 12 having an island shape is formed a region which overlaps a channel region of the semiconductor layer 13. Particularly, an Al film is formed by a sputtering method and is then patterned by a photolithographic process.

Figure 7B:
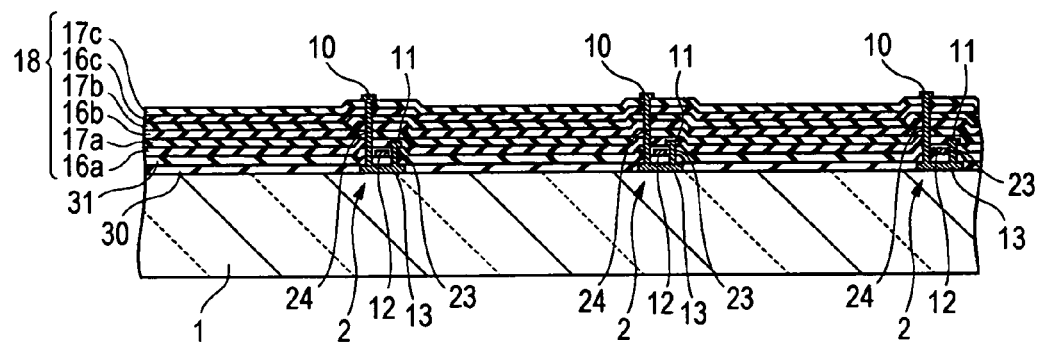
FIG. 7B is a cross-sectional view illustrating the process of the process shown in FIG. 7A.
Figure 7C:
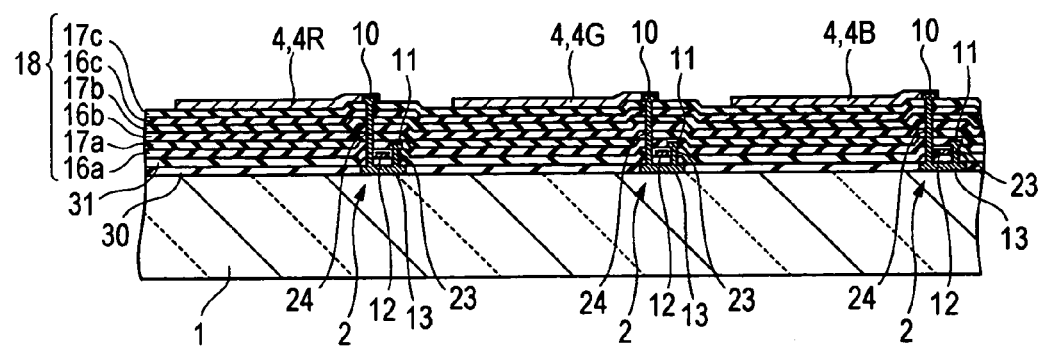
FIG. 7C is a cross-sectional view of illustrating the process of the process shown in FIG. 7B.

Subsequently, as shown in FIG. 7B, a first interlayer insulating layer 31 is formed. Particularly, a $SiO_2$ film is formed with a thickness of 800 nm by a CVD method or the other deposition method. Subsequently, contact holes 23 connected to the source regions of the semiconductor layer 13 are formed. Particularly, the contact holes 23 are formed by forming through holes which reach the source regions of the semiconductor layer 13 by mask etching of the gate insulating layer 30 and the first interlayer insulating layer 31 and filling a conductive material such as Al in the through holes. Thereafter, a source electrode 11 connected to the contact hole 23 is formed on the first interlayer insulating 31 and second interlayer insulating layers 16a, 16b, 17a, 17b, 16c, and 17c are formed on the first interlayer insulating layer 31 to cover the source electrode 11.

Next, contact holes 24 each connected to drain regions of the semiconductor layer 13 are formed in the second interlayer insulating layers 16a to 17c. Particularly, the contact holes 24 are formed by forming through holes which reach the drain regions of the semiconductor layer 13 by mask etching of the second interlayer insulating layers 16a to 17c and filling a conductive material such as Al in the through holes. Thereafter, pixel electrodes 4 connected to the contact holes 24 are formed on the second interlayer insulating layer 17c. Particularly, the pixel electrode formed of ITO are in a predetermined pattern by a sputtering method. The pixel electrode 4 is formed with the above-described optimized film thickness for each color. Particularly, the pixel electrode 4R of the R pixel is formed with a thickness of 95 nm, the pixel electrode 4G of the G pixel is formed with a thickness of 50 nm, and the pixel electrode 4B of the B pixel is formed with a thickness of 50 nm.

Figure 8A:
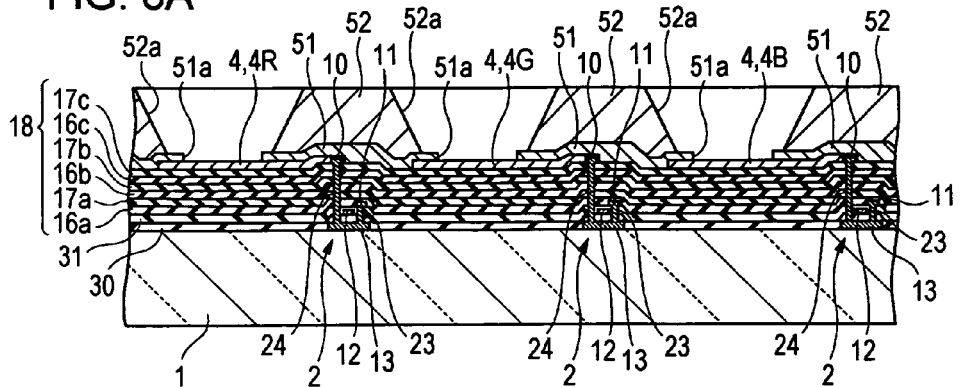
FIG. 8A is a cross-sectional view illustrating the process of the process shown in FIG. 7C.

Next, as shown in FIG. 8A, a first bank portion (partition wall) 51 made of $SiO_2$ and having an opening 51a corresponding to each pixel region A (see FIG. 2) is formed. Particularly, a $SiO_2$ thin film forming process, a photolithography process, and an etching process are performed. The first bank portion 51 is formed such that the edge of the opening 51 overlaps the edge of the pixel electrode 4. Also, a second bank portion (partition wall) 52 having an opening 52a corresponding to each pixel region A is formed on the first bank portion 51. This second bank portion 52 is made of polyacrylic resin by a process of coating a solution containing polyacrylic resin, a process of drying the coated film, and a photolithography process, and an etching process.

Figure 8B:
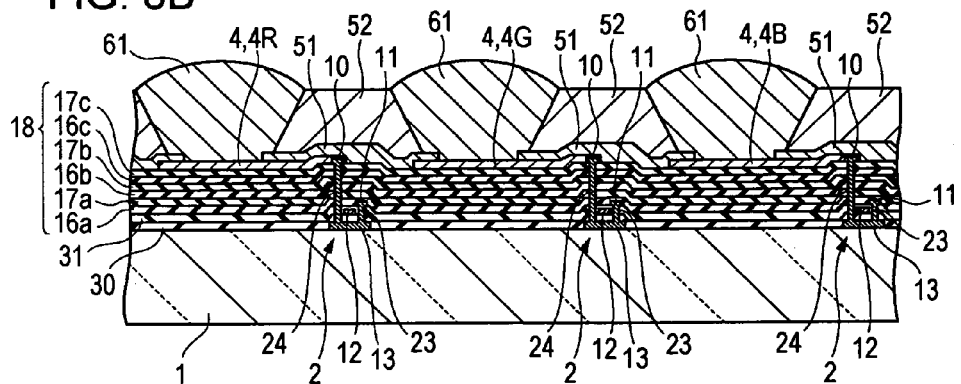
FIG. 8B is a cross-sectional view illustrating the process of the process shown in FIG. 8A.

Next, as shown in FIG. 8B, a liquid composition 61 is arranged on the pixel electrodes 4 in the openings 51a and 52a formed in the bank portions 51 and 52. Here, as a method of arranging the liquid composition, a known liquid phase method (wet process and wet coating method) such as a spin coat method, an inkjet (liquid droplet discharge) method, a slit coat method, a deep coat method, a spray deposition method, or a print method is employed. The liquid phase method is suitable for forming a high molecular material and enables the organic EL device to be manufactured with low cost without using expensive equipment such as a vacuum device, compared with a gas phase method. The liquid composition 61 is arranged on the pixel electrode 4 in each opening 5 using the liquid phase method.

Figure 8C:
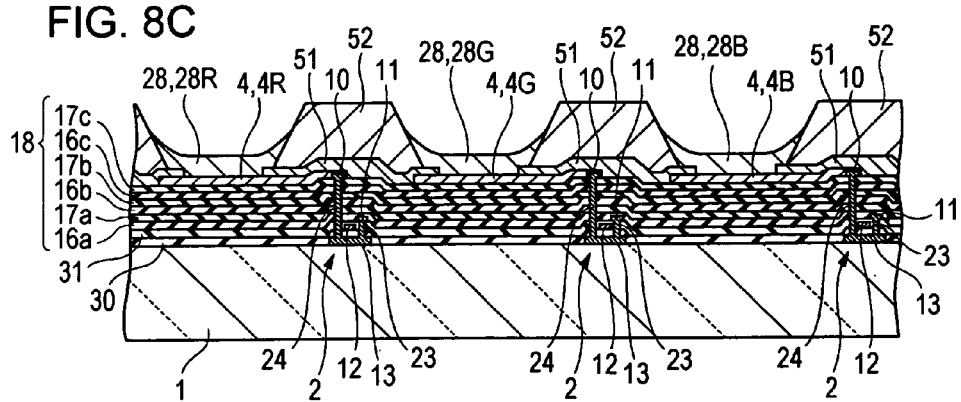
FIG. 8C is a cross-sectional view of illustrating the process of the process shown in FIG. 8B.

The liquid composition 61 is made by melting or dispersing a material for forming a hole injection/transport layer 28 in a solvent, by melting or dispersing a material forming an intermediate layer 29 in a solvent, or by melting or dispersing a material for forming an light-emitting layer (organic EL layer) 7 in a solvent. That is, whenever each of the hole injection/transport layer 28, the intermediate layer 29, and the light-emitting layer 7 is formed, the liquid composition 61 which is a material of each layer is arranged and dried. As shown in FIG. 8C, after forming the hole injection/transport layer 28, the intermediate layer 29 is formed and then the light-emitting layers 7R, 7G, and 7B having respective colors are formed.

The hole injection/transport layer 28 is formed with the above-described optimized film thickness for each color. Particularly, the hole injection/transport layer 28R of the R pixel is formed with a thickness of 70 nm, the hole injection/transport layer 28G of the G pixel is formed with a thickness of 70 nm, and the hole injection/transport layer 28B of the B pixel is formed with a thickness of 30 nm. The intermediate layer 29 is formed with the above-described optimized film thickness for each color. Particularly, the intermediate layer 29R of the R pixel is formed with a thickness of 8 nm, the intermediate layer 29G of the G pixel is formed with a thickness of 8 nm, and the intermediate layer 29B of the B pixel is formed with a thickness of 8 nm. In addition, the light-emitting layer 7 is formed with the above-described optimized film thickness for each color. Particularly, the light-emitting layer 7R of the R pixel is formed with a thickness of 96 nm, the light-emitting layer 7G of the G pixel is formed with a thickness of 90 nm, and the light-emitting layer 7B of the B pixel is formed with a thickness of 70 nm.

Subsequently, an electron injection layer 8 is formed of LIF on the entire surface of the transparent substrate 1 (that is, on the second partition wall 52 and the light-emitting layer 7 in the opening 5 corresponding to the pixel region) by a vacuum deposition method, and an counter electrode (cathode) 9 is formed of Al on the electron injection layer 8 by a vacuum deposition method, thereby capable of forming the organic EL device 100 having the structure shown in FIG. 2.

Second Embodiment

Next, the procedure except for determining of the thickness of each layer of the organic EL device 100 having the same structure as the first embodiment will be described. In this method, under the assumption that external isoenergetic white light is vertically incident from the transparent substrate 1 and the insulator laminated film 18 onto the organic EL device 100 toward the pixel electrode 4 and the light-emitting layer 7, the thickness of each layer is determined such that the intensity of the reflected light of the R, G, and B pixels in the luminescence peak wavelength is minimized.

Here, the external light which is vertically incident to the organic EL device 100 need not be limited to isoenergetic white light. In consideration of the reflectance, the method of determining the thickness according to this embodiment is equal to a method of the thickness of each layer such that the reflectance of each of the R pixel, the R pixel, and the B pixel in the luminescence peak wavelength is minimized. The "intensity of the reflected light" described herein is an intensity of the reflected light of the incident light which runs from the insulator laminating layer 18 to the pixel electrode 4 and the light-emitting layer 7, that is, the total output light from the pixel electrode 4 toward the insulator laminated film 18, and the "reflectance" is a ratio of the intensity of the reflected light, that is, the total output light from the pixel electrode 4 to the insulator laminated film 18, to the intensity of the incident light from the insulator laminated film 18 to the pixel electrode 4 and the light-emitting layer 7. Even in this determining method, the same combination of the thickness (shown in FIG. 3) as the first embodiment can be obtained and thus it is possible to improve the color purity of the output light.

Accordingly, in the obtained organic EL device 100, when the light-emitting layer 7 emits the light, resonance occurs by the reflection at the interface between the intermediate layer 29 and the hole injection/transport layer 28, the interface between the hole injection/transport layer 28 and the pixel electrode 4, the interface between the pixel electrode 4 and the insulator laminated film 18, and the interfaces between the second interlayer insulating layers 17a to 17c having a low refractive index and the second interlayer insulating layer 16a to 16c having a high refractive index, and thus, even in the luminescence peak wavelength of any one of the R pixel, the G pixel, and the B pixel, the light having an intensity higher than that of the case of not having the insulator laminated film 18 is emitted from the insulator laminated film 18 outward (toward the opposite side of the insulator laminated film 18 to the light-emitting layer 7, that is, the transparent substrate 1). Furthermore, when light is vertically incident to the organic EL device 100 from the insulator laminated film 18 to the pixel electrode (light transmitting electrode) 4 and the light-emitting layer 7, the reflectance of the light in any one wavelength in ± 20 nm of the luminescence peak wavelength of the R pixel, the G pixel, and the B pixel is lower than the reflectances of the light in any other wavelengths of the luminescence peak wavelength in ± 50 nm of the luminescence peak wavelength, by reflection at the interface between the intermediate layer 29 and the hole injection/transport layer 28, the interface between the hole injection/transport layer 28 and the pixel electrode 4, the interface between the pixel electrode 4 and the insulator laminated film 18, and the interfaces between the second interlayer insulating layers 17a to 17c having a low refractive index and the second interlayer insulating layers 16a to 16c having a high refractive index. For example, when the external light is vertically incident to the organic EL device 100, in the range of ± 50 nm of the luminescence peak wavelength (620 nm) of the R pixel, the reflectance of the light in any one wavelength in ± 20 nm of the luminescence peak wavelength of the R pixel is the lowest.

Figure 9:
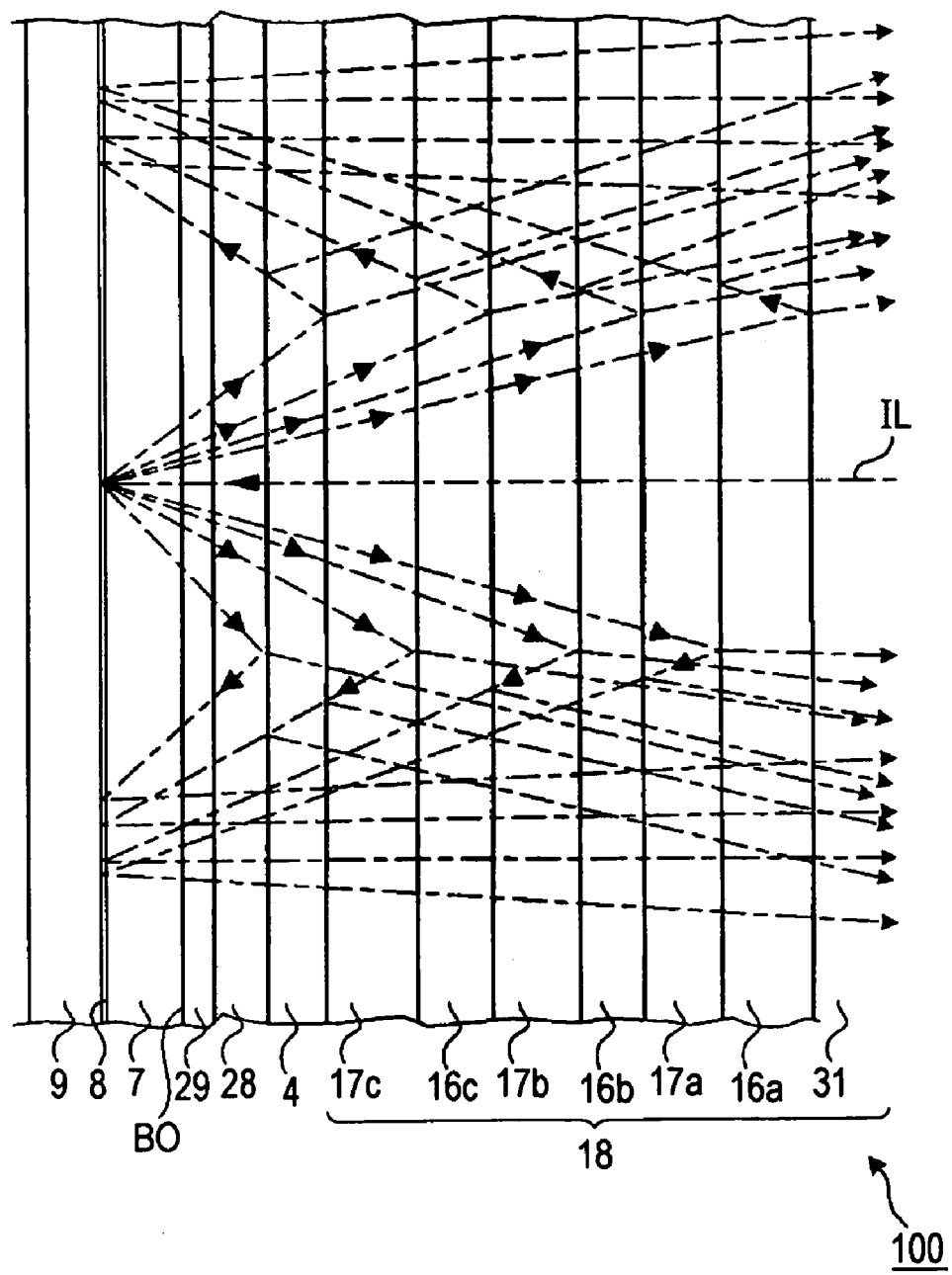
FIG. 9 is a view schematically illustrating an example of a path of light due to a vertically incident light in the organic EL device according to the invention.

FIG. 9 schematically illustrates an example of a path of light due to a vertically incident light IL in the organic EL device 100 according to this embodiment. In FIG. 9, solid lines represent the interfaces between the layers and dashed dot lines represent paths of light. The paths of the light are representative examples. Although other light paths may exist, they are not shown for clarity. In addition, the angles of the dashed dot lines do not exactly represent the angles of the light, but are easily shown so as to distinguish the plurality of the paths. As can be apparently seen from FIG. 9, a portion of light, which is not absorbed into the counter electrode 9, is reflected in the right direction of the drawing in the interface between the reflective counter electrode 9 and the electron injection layer 8. Moreover, the reflection and refraction occurs in the interface between two layers transmitting the light. Resultantly, the reflected light from the pixel electrode 4 to the insulator laminated film 18 is emitted from the insulator laminated film 18 to the right side of the drawing. In this embodiment, the thickness of each layer is determined using the sum of the reflected light or the reflectance which is a ratio of the sum of the reflected light to the incident light.

First, the premise of the procedure of determining the thicknesses of the layers to be explained below will be described. A reflectance R, a transmittance T at the interface between two layers upon the vertical incidence, a phase variation $\phi r$ upon the reflection, and a phase variation $\phi t$ upon the transmission are obtained by the following Equations 2 to 5. Here, $n_1$ is the refractive index of the incident side of a medium, $n_2$ is the refractive index of the emitting side of the medium, and $k_2$ is an optical quenching factor of the emitting side of the medium. The refractive index and the optical quenching factor depend on the wavelength of the light.

$$R=\{(n_1-n_2)^2+k_2^2\}/\{(n_1+n_2)^2+k_2^2\} \quad (2)$$

$$T=4n_1n_2/\{(n_1+n_2)^2+k_2^2\} \quad (3)$$

$$\phi r=\tan^{-1}\{2n_1k_2/(n_1^2-n_2^2-k_2^2)\} \quad (4)$$

$$\phi t=\tan^{-1}\{k_2/(n_1+n_2)\} \quad (5)$$

In the isoenergetic white light which is vertically incident to the organic EL device 100 from the outside through the transparent substrate 1, the intensity (amplitude) and the phase of the reflected light and the intensity (amplitude) and the phase of the transmitted light at each interface are obtained using the thickness of each layer and Equations 2 to 5, and the intensity (or amplitude) of the total reflected light which is internally reflected and emitted outward through the transparent substrate 1 is estimated. Further, an optimal thickness of each layer is obtained by repeatedly estimating the intensity of the total reflected light emitted outward from the insulator laminated film 18 while varying the thickness of each layer. The light which is emitted and reflected up to three times is summed up in the estimation of the intensity. This is because the light which is reflected more than three times is significantly attenuated by absorption of the light into the layer.

As a condition, the thicknesses of the pixel electrode 4, the hole injection/transport layer 28, and the light-emitting layer 7 are made to be vary in a range of an actual thickness. Particularly, under the assumption that ITO is used as the material of the pixel electrode 4, the range of the thickness thereof is made to be limited to 40 mm to 100 nm. Further, under the assumption that PEDOT/PSS is used as the material of the hole injection/transport layer 28, the range of the thickness thereof is made to be limited to 20 nm to 100 nm. Furthermore, the range of the thickness of the light-emitting layer 7 is made to be limited to 60 nm to 100 nm.

The intensity of the total reflected light emitted outward is estimated by simulation using a software. Particularly, the software having a product name "OPTAS-FILM" which is available from Cybernet Systems Co., Ltd., Tokyo, Japan, in August, 2005 is used.

(Step 1) Although the intensity of the reflected light in the luminescence peak wavelength of the corresponding pixel must be made to be finally as small as possible even in any one of the regions which overlap the R pixel, the G pixel, and the B pixel, in order to equalize the thickness of each of the high refractive-index layer (second interlayer insulating layers 16a, 16b, and 16c) and the low refractive-index layer (second interlayer insulating layers 17a, 17b, and 17c) of the insulator laminated film 18 in every regions, the thicknesses of the high refractive-index layer 16a, the low refractive-index layer 17a, the high refractive-index layer 16b, the low refractive-index layer 17b, the high refractive-index layer 16c, the low refractive-index layer 17c, the pixel electrode 4G, the hole injection/transport layer 28G, the intermediate layer 29G, and the light-emitting layer 7G are made to be optimized in the region which overlaps the G pixel having the luminescence peak wavelength of about 540 nm which is substantially a center wavelength of a visible ray region. Particularly, the intensity of the total reflected light emitted outward in the emission wavelength is repeatedly estimated while varying the thickness of each layer, a combination of the thickness of the light having a lowest intensity in the luminescence peak wavelength is selected as an optimal thickness combination. Since a refractive index and an optical quenching factor depend on the wavelength of light, in this step, the optical constants (refractive index and optical quenching factor) of the green wavelength (540 nm) are used. In this way, the thickness of each layer of the region which overlaps the G pixel can be obtained and the result is the same as shown in FIG. 3.

(Step 2) Next, in the region which overlaps the R pixel (luminescence peak wavelength is about 620 nm), the thicknesses of the high refractive-index layers 16a, 16b, and 16c and the low refractive-index layers 17a, 17b, and 17c are fixed to the values obtained in the step 1, and the thicknesses of the pixel electrode 4R, the hole injection/transport layer 28R, the intermediate layer 29R, and the light-emitting layer 7R is made to be optimized. Particularly, the intensity in luminescence peak wavelength of the total reflected light emitted outward from the insulator laminated film 18 is repeatedly estimated while varying the thicknesses of the pixel electrode 4R, the hole injection/transport layer 28R, the intermediate layer 29R, and the light-emitting layer 7R under the condition that the thicknesses of the high refractive-index layers 16a, 16b, and 16c and the low refractive-index layers 17a, 17b, and 17c are defined, and the thickness combination by which the reflected light having the lowest intensity in the luminescence peak wavelength is emitted is selected as an optimal thickness combination. In this step, the optical constants (the refractive index and the optical quenching factor) of the red wavelength (620 nm) are used. In this way, the thickness of each layer of the region which overlaps the G pixel can be obtained and the result is the same as shown in FIG. 3.

(Step 3) Next, in the region which overlaps the B pixel (its luminescence peak wavelength is about 470 nm), the thicknesses of the high refractive-index layers 16a, 16b, and 16c and the low refractive-index layers 17a, 17b, and 17c are fixed to the values obtained in the step 1, and the thicknesses of the pixel electrode 4B, the hole injection/transport layer 28B, the intermediate layer 29B, and the light-emitting layer 7B are made to be optimized. Particularly, the intensity in luminescence peak wavelength of the total reflected light emitted outward from the insulator laminated film 18 is repeatedly estimated while varying the thicknesses of the pixel electrode 4B, the hole injection/transport layer 28B, the intermediate layer 29B, and the light-emitting layer 7B under the condition that the thicknesses of the high refractive-index layers 16a, 16b, and 16c and the low refractive-index layers 17a, 17b, and 17c are defined, and the thickness combination by which the reflected light having the highest intensity in the luminescence peak wavelength is emitted is selected as an optimal thickness combination. In this step, the optical constants (refractive index and optical quenching factor) of the blue wavelength (470 nm) are used. In this way, the thickness of each layer of the region which overlaps the B pixel can be obtained and the result is the same as shown in FIG. 3.

As described above, first, in the region which overlaps the G pixel, the thicknesses of the layers including the thicknesses of the high refractive-index layers 16a, 16b, and 16c and the low refractive-index layers 17a, 17b, and 17c of the insulator laminated film 18 are determined and then, in the region which overlaps the other pixel, these layers of the insulator laminated film 18 are fixed and the thickness of the other layer is determined. However, in the step (step 1) of optimizing the high refractive-index layers 16a, 16b, and 16c and the low refractive-index layers 17a, 17b, and 17c, the region which overlaps any one of the R pixel, the G pixel, and the B pixel may be used as a reference for determining the thickness. However, if the region which overlaps the G pixel which is nearly the center wavelength of the visible ray is used as the reference like this embodiment, even in any one of the regions which overlap the R pixel, the G pixel, and the B pixel, the thicknesses of the pixel electrode 4, the hole injection/transport layer 28, the intermediate layer 29, and the light-emitting layer 7 are easily determined such that the light having the high intensity is emitted outward.

Figure 10:
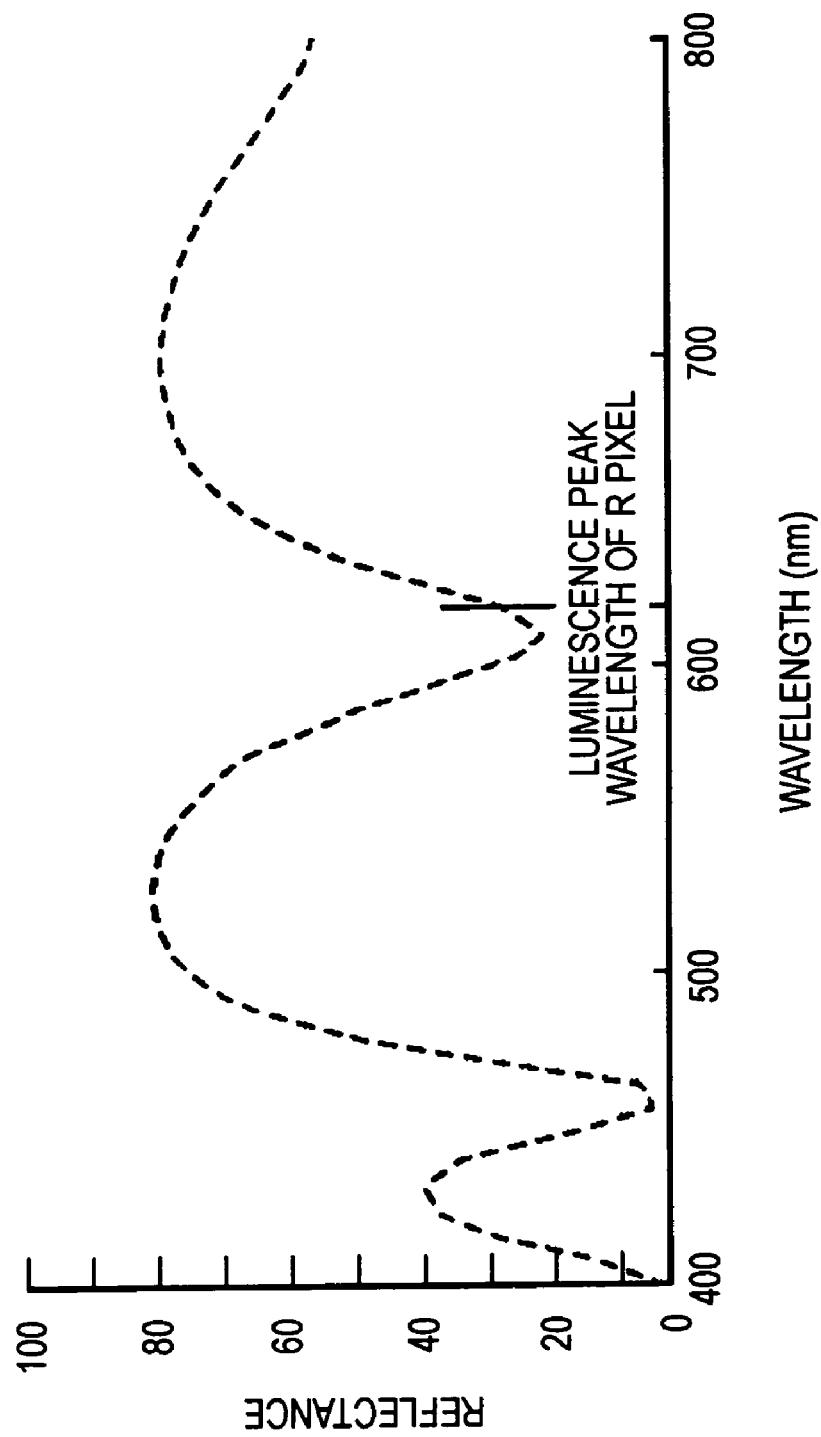
FIG. 10 is a view illustrating a reflectance spectrum of light which is vertically incident from the outside onto the region which overlaps a R pixel in the organic EL device according to the invention.
Figure 11:
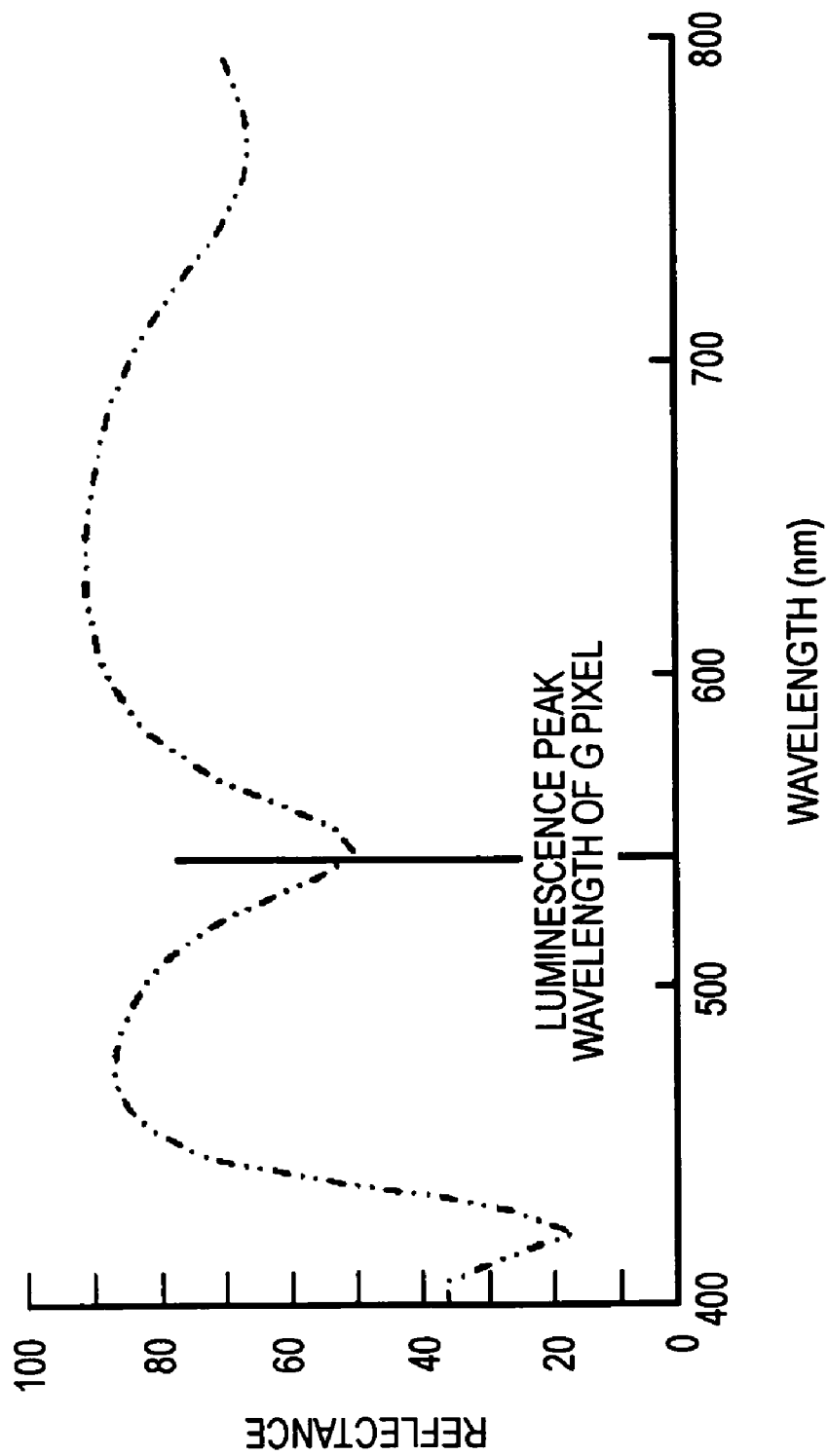
FIG. 11 is a view illustrating a reflectance spectrum of light which is vertically incident from the outside onto the region which overlaps a G pixel in the organic EL device according to the invention.

FIGS. 10 through 12 illustrate reflectance spectrums of the light which is vertically incident from the outside of the region which overlaps each pixel of the organic EL device 100 through the transparent substrate 1 in the organic EL device 100. FIG. 10 illustrates the reflective spectrum of the region which overlaps the R pixel, FIG. 11 illustrates the reflectance spectrum of the region which overlaps the G pixel, and FIG. 12 illustrates the reflectance spectrum of the region which overlaps the B pixel. As can be seen from the drawings, the reflectance in one wavelength in ± 20 nm of the luminescence peak wavelength of each of the R pixel, the G pixel, and the B pixel is lower than the reflectances of any other wavelengths in ± 50 nm of the luminescence peak wavelength. For example, when light is vertically incident from the outside onto the organic EL device 100, in the range of ± 50 nm of the luminescence peak wavelength (620 nm) of the R pixel, a wavelength representing the lowest reflectance is in the ± 20 nm of the luminescence peak wavelength of the R pixel.

According to the method of determining the thickness of each layer of this embodiment, the same organic EL device 100 (shown in FIG. 3) as the first embodiment can be obtained. Accordingly, the graph representing the spectrum of the light emitted from the region which overlaps each pixel of the organic EL device 100 according to this embodiment through the transparent substrate 1 is the same as shown in FIG. 5. As described in the first embodiment, referring to FIG. 5 and FIG. 6 related to the comparative example, according to this embodiment, the color purity of the output light can be improved.

Furthermore, the plurality of the low refractive-index layers 17a, 17b, and 17c of the insulator laminated film 18 have different thicknesses, but each of the low refractive-index layers 17a, 17b, and 17c has the constant thickness even in any one of the regions which overlap the R pixel, the G pixel, and the B pixel. The plurality of the high refractive-index layers 16a, 16b, and 16c also have different thicknesses, but each of the high refractive-index layers 16a, 16b, and 16c has the constant thickness even in any one of the regions which overlap the R pixel, the G pixel, and the B pixel. Accordingly, it is unnecessary to vary the thickness depending to the pixel. That is, the parts of the insulator laminated film 18 which overlap the R pixel, the G pixel, and the B pixel have a common structure. Furthermore, it is unnecessary to separately design a layer suitable for resonance of R light, a layer suitable for resonance of G light, and a layer suitable for resonance of B light. In addition, since each of the second interlayer insulating layers 16a to 16c and 17a to 17c has the constant thickness, all contact holes 24 can be collectively formed by the etching. Accordingly, the structure of the organic EL device 100 is simple and the manufacturing thereof is easy.

Conventionally, in the structure in which the light resonates in the insulator laminated film in which the plurality of low refractive-index layers and the plurality of high refractive-index layers are alternately laminated, it is general that the low refractive-index layers have the same thickness and the high refractive-index layers have the same thickness on the basis of Equation 1. However, the present inventor found that superior resonance effect couldn't be obtained by this structure. Rather, as in this embodiment, if the plurality of low refractive-index layers 17a, 17b, and 17c have the different thicknesses and the plurality of the high refractive-index layers 16a, 16b, and 16c have the different thicknesses, it is possible to emit light with a high intensity by resonating light of any color of R, G, and B.

Furthermore, according to this embodiment, since a combination of the thicknesses of the layers (including the pixel electrode 4 and the light-emitting layer 7) from the pixel electrode (light transmitting electrode) 4 to the light-emitting layer 7 is different depending on the luminescence color of the pixel, adequate reflection characteristics can be easily obtained according to the luminescence color, while the parts of the insulator laminated film 18 which overlap the R pixel, the G pixel, and the B pixel have the common structure. It is generally difficult to form a thin film having different thicknesses depending on the region, and the process thereof is complex. Particularly, in the case of using the high molecular light-emitting layer 7, since the hole injection/transport layer 28 and the light-emitting layer 7 can be formed by using a method of dropping a liquid material such as an inkjet method, the thicknesses of the hole injection/transport layer 28 and the light-emitting layer 7 can be easily controlled by adequately adjusting the drop amount of the liquid material.

Other Thickness Combination

If the thickness of each layer is calculated according to the first embodiment and the second embodiment described above, in addition to the above-mentioned thickness combination (FIG. 3), other combinations can be obtained. These combinations (type A~type L) are shown in FIGS. 13 through 15. In FIGS. 13 through 15, R, G, and B represent the regions which overlap the R pixel, the region which overlaps the G pixel, respectively, and the region which overlaps the B pixel, respectively. As in FIG. 3, a layer written upper in FIGS. 13 through 15 corresponds to a layer further form the first counter electrode layer.

In the organic EL devices of type A to type L shown in FIGS. 13 through 15, when the light-emitting layer 7 emits the light, resonance occurs by the reflection at the interface between the intermediate layer 29 and the hole injection/transport layer 28, the interface between the hole injection/transport layer 28 and the pixel electrode 4, the interface between the pixel electrode 4 and the insulator laminated film 18, and the interfaces between the second interlayer insulating layers 17a to 17c having a low refractive index and the second interlayer insulating layers 16a to 16c having a high refractive index, and, even in the luminescence peak wavelength of any one of the R pixel, the G pixel, and the B pixel, light having the intensity higher than that of the case of not having the insulator laminated film 18 is emitted outward (toward the opposite side of the insulator laminated film 18 to the light-emitting layer 7, that is, the transparent substrate 1) from the insulator laminated film 18. Further, when light is vertically incident from the insulator laminated film 18 toward the pixel electrode (light transmitting electrode) 4 and the light-emitting layer 7 in the same organic EL device, the reflectance of any one wavelength in ± 20 nm of the luminescence peak wavelength of each of the R pixel, the G pixel, and the B pixel is lower than the reflectance in any other wavelength in ± 50 nm of the luminescence peak wavelength by the reflection at the interface between the intermediate layer 29 and the hole injection/transport layer 28, the interface between the hole injection/transport layer 28 and the pixel electrode 4, the interface between the pixel electrode 4 and the insulator laminated film 18, and the interfaces between the second interlayer insulating layers 17a to 17c having a low refractive index and the second interlayer insulating layers 16a to 16c having a high refractive index. Accordingly, the same effect as in the first embodiment and the second embodiment can be obtained.

In the first and second embodiments, the number of the layers in the insulator laminated film 18, that is, the number of the high refractive-index layers and the low refractive-index layers is 6. However, as can be seen from the type G of FIG. 14, the number of the layers in the insulator laminated film 18 may be 8, 2, 4, 10, or more. However, if the number of the layers increases, viewing dependency becomes stronger. That is, the viewing angle becomes narrower.

Third Embodiment

Figure 16:
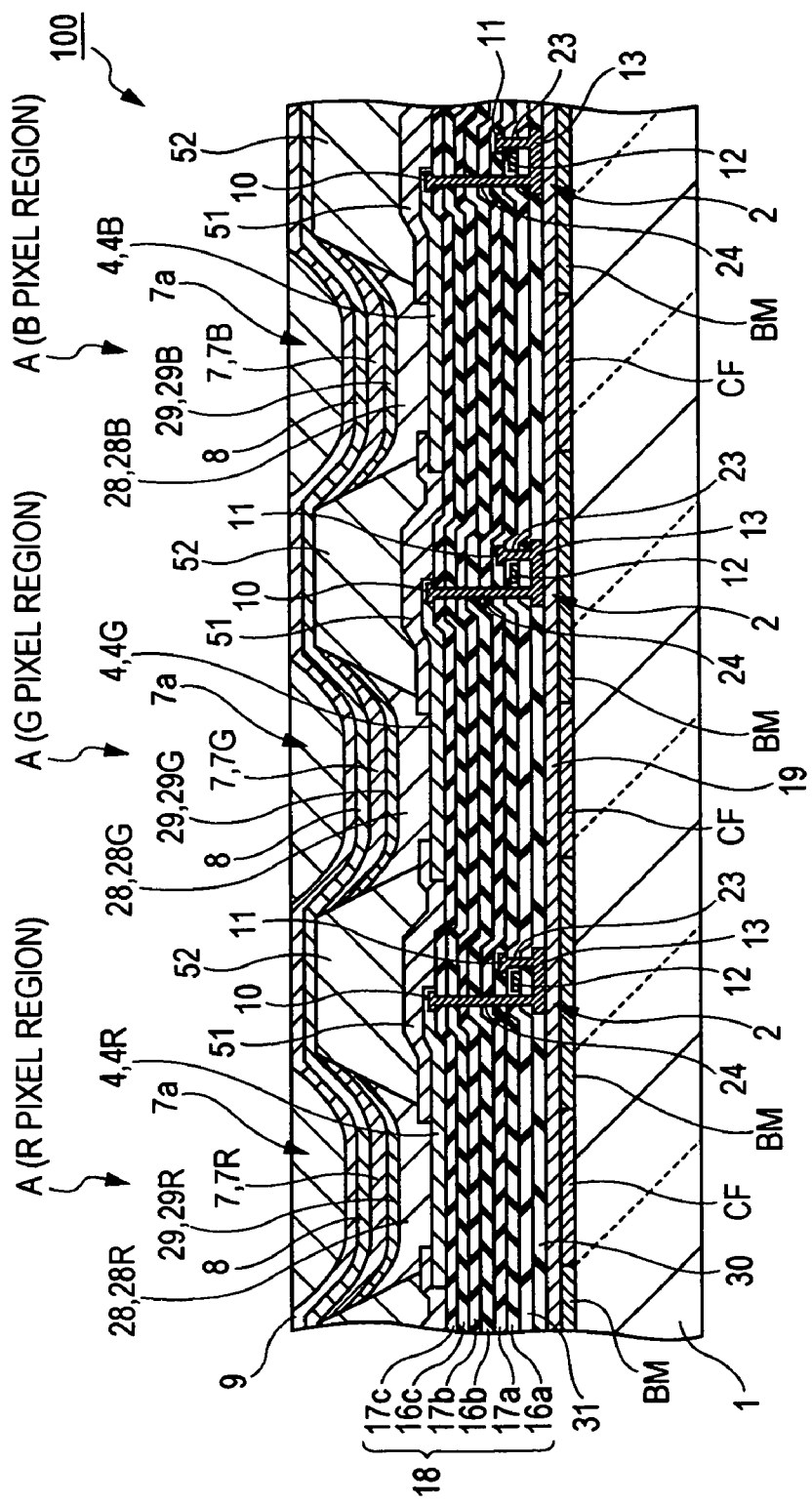
FIG. 16 is a cross-sectional view of a full-color emission organic EL device according to a third embodiment of the invention.

Furthermore, the organic EL Device 100 may be modified as shown in FIG. 16. In a third embodiment shown in FIG. 16, a color filter overlaps each of the R pixel, the G pixel, and the B pixel. The color filter CF transmits the light within the wavelength region of the color of the corresponding pixel and absorbs the light within the other wavelength regions. For example, the color filter CF which overlaps the R pixel transmits the light within the red wavelength region (near 620 nm) and absorbs the light within the other wavelength regions. The color filter CF is adhered to the transparent substrate 1 through which the light is emitted from the pixel and is surrounded by a black matrix BM. A protective film 19 overlaps the color filter CF and the black matrix BM and an insulator laminated film 18 is provided thereon. By overlapping the color filter CF with each pixel, contrast and color purity can be improved. That is, when the pixel emits light, the color purity of the light is improved, and, when the pixel does not emit the light, the pixel becomes darker.

Fourth Embodiment

Figure 17:
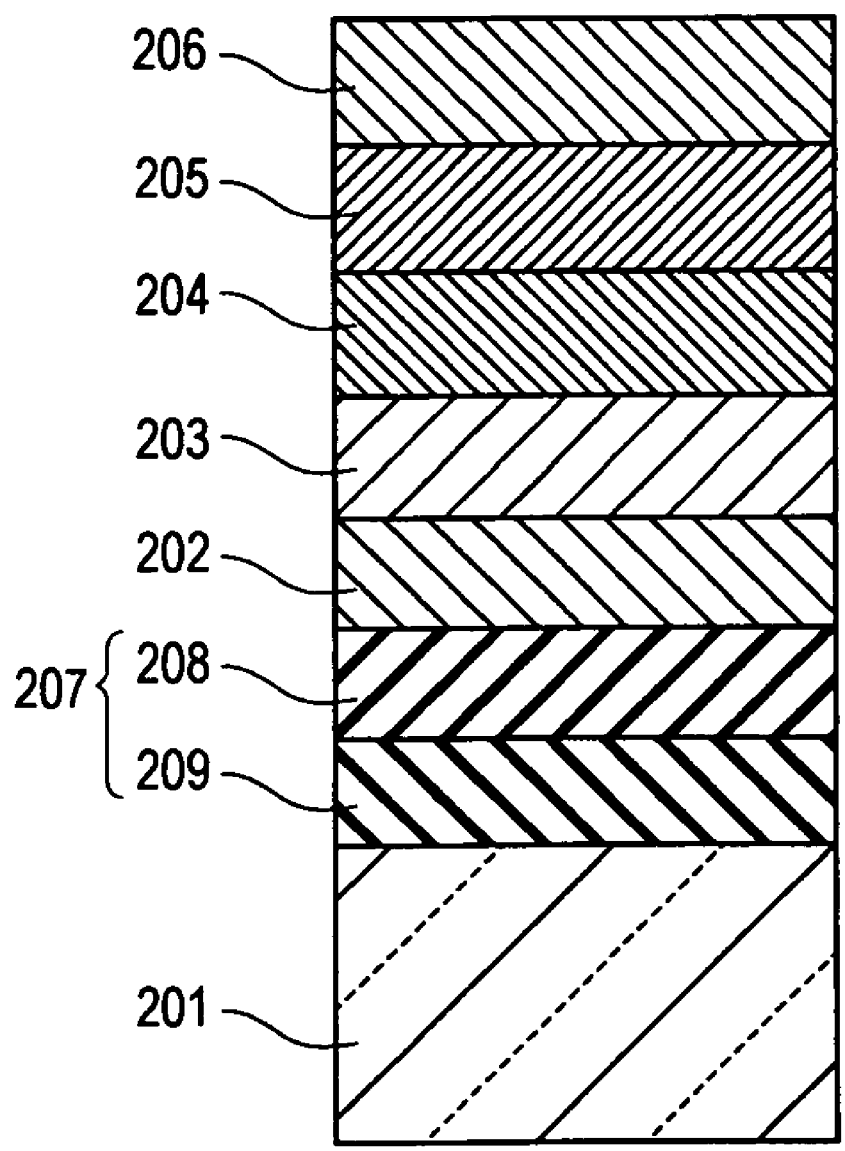
FIG. 17 is a cross-sectional view of a full-color emission organic EL device according to a fourth embodiment of the invention.

FIG. 17 illustrates a portion of an inorganic EL device according to a fourth embodiment of the invention. Although the organic EL device is illustrated as the embodiment of the EL device according to the invention, the inorganic EL device is also included in the scope of the invention. As shown in FIG. 17, the inorganic EL device has a light transmitting electrode 202 formed of, for example, ITO on a transparent substrate 201 made of, for example, glass, a first insulating film 203 formed of, for example, $SiN_x$, a light-emitting layer 204 formed thereon, a second insulating film 205 formed of, for example, $SiN_x$, and a rear electrode 206 formed of, for example, Al. According to the invention, by inserting a layer-insulator laminated film 207 having a low refractive-index layer 208 formed of, for example, $SiO_2$ and a high refractive-index layer 209 formed of, for example, $SiN_x$ between the transparent substrate 201 and the light transmitting electrode 202, the thickness of each of the low refractive-index layer 208 and the high refractive-index layer 209 are equalized even in any one of the regions which overlap a R pixel, a G pixel, and a B pixel, and a combination of the thicknesses of the light transmitting electrode 201, the first insulating film 203, and the light-emitting layer 204 is made to be different from one another by the luminescence color of the pixel.

The thickness of each layer is determined similar to the first embodiment or the second embodiment. In the inorganic EL device having the above-mentioned structure, when the light-emitting layer 204 emits light, resonance occurs by reflection at the interface between the first insulating film 203 and the light transmitting electrode 202, the interface between the light transmitting electrode 202 and the layer-insulator laminated film 207, and the interface between the low refractive-index layer 208 and the high refractive-index layer 209, and even in the luminescence peak wavelength of any one of the R pixel, the G pixel, and the B pixel, the light having an intensity higher than that of the case of not having the layer-insulator laminated film 207 is emitted from the insulator laminated film 207 outward (toward the opposite side of the insulator laminated film 207 to the light-emitting layer 204, that is, the side of the transparent substrate 201). Furthermore, when the light is vertically incident from the insulator laminated film 207 onto the inorganic EL device toward the light transmitting electrode 202 and the light-emitting layer 204, by the reflection at the interface between the first insulating film 203 and the light transmitting electrode 202, the interface between the light transmitting electrode 202 and the layer-insulator laminated film 207, and the interface between the low refractive-index layer 208 and the high refractive-index layer 209, the reflectance in any one wavelength in ± 20 nm of the luminescence peak wavelength of each of the R pixel, the G pixel, and the B pixel is lower than that of any other wavelengths in ± 50 nm of the luminescence peak wavelength. Accordingly, the same effect as in the first embodiment and the second embodiment can be obtained. Here, the first insulating film 203 may not exist.

Electronic Apparatus

Figure 18A:
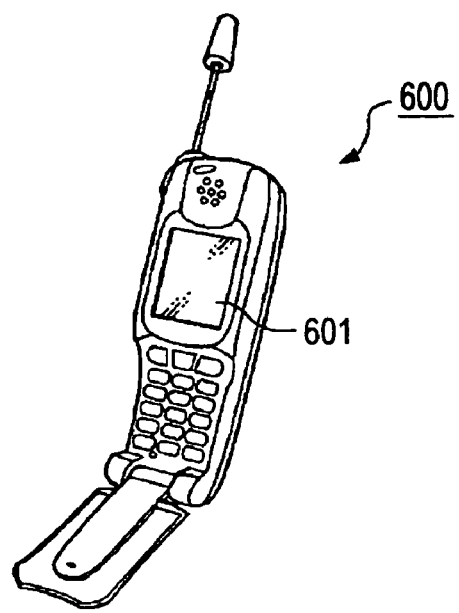
FIG. 18A is a view illustrating an electronic apparatus according to the invention.
Figure 18B:
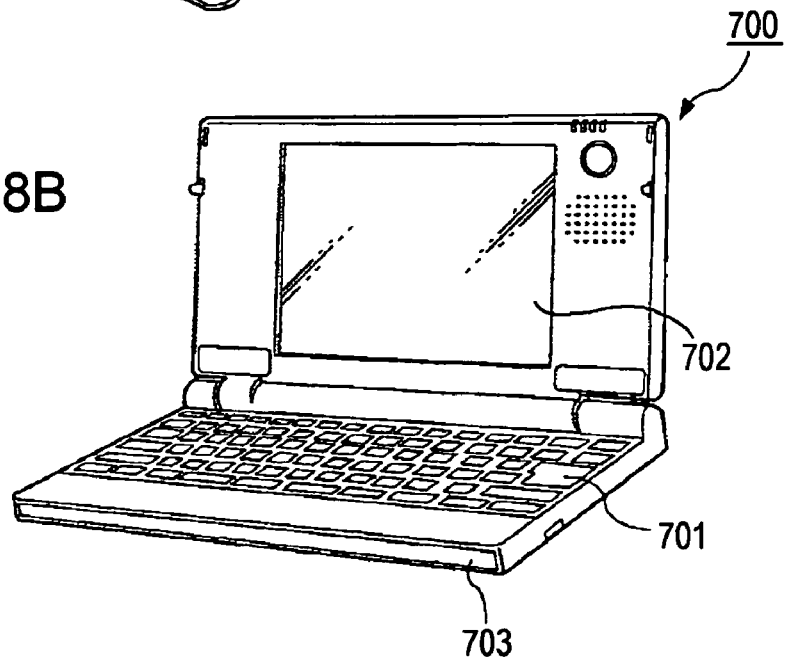
FIG. 18B is a view illustrating another electronic apparatus according to the invention.
Figure 18C:
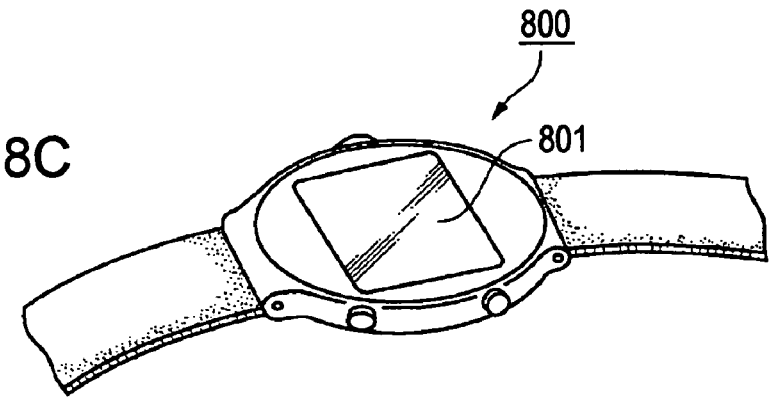
FIG. 18C is a view illustrating a further electronic apparatus according to the invention.

Next, various electronic apparatuses including the EL device according to the invention will be described with reference to FIG. 18. FIG. 18A is a perspective view illustrating an example of a portable phone. In FIG. 18A, reference numeral 600 denotes a portable phone main body and reference numeral 601 denotes a display unit using any one of the above-described EL devices. FIG. 18B is a perspective view illustrating an example of a portable information processing apparatus such as a word processor, a personal computer, and so on. In FIG. 18B, reference numeral 700 denotes an information processing apparatus, reference numeral denotes an input unit such as a keyboard, reference numeral 703 denotes an information processing apparatus main body, and reference numeral 702 denotes a display unit using any one of the above-described EL devices. FIG. 18C is a perspective view illustrating an example of a wristwatch type electronic apparatus. In FIG. 18C, reference numeral 800 denotes a wristwatch main body and reference numeral 801 denotes a display unit using any one of the above-described EL devices.

Since the electronic apparatuses shown in FIGS. 18A through 18C have any one of the above-mentioned EL devices as a display unit, display can be performed with high color purity.

What is claimed is:

1. An electroluminescent device comprising:
   a substrate;

pixels over the substrate, the pixel including a first color pixel which emits a first color light and a second color pixel which emits a second color light, the pixels including a common electrode, each of the first color pixel and the second color pixel including a light transmitting pixel electrode and a light-emitting layer between the common electrode and the corresponding light transmitting pixel electrode;

an insulator laminated film to a side of the light transmitting pixel electrodes that is opposite from a side at which the light-emitting layers are disposed, the insulator laminated film having a plurality of low refractive-index layers each formed of a light transmitting insulator and a plurality of high refractive-index layers each formed of a light transmitting insulator having a refractive index higher than the refractive-index of the light transmitting insulator of the low refractive-index layers, one of the low refractive-index layers being interposed between two of the high refractive-index layers, each low refractive-index layer is formed over the entire luminescent region of the first color pixel and the second color pixel and has a substantially constant thickness in regions which overlap the first color pixel and the second color pixel, each high refractive-index layer is formed over the entire luminescent region of the first color pixel and the second pixel and has a substantially constant thickness in regions which overlap the first color pixel and the second color pixel, the plurality of the low refractive-index layers have thicknesses that are different from each other, the plurality of the high refractive-index layers have thicknesses that are different from each other, and the thicknesses of the low refractive-index layers and the high refractive-index layers are determined such that, light emitted from the light-emitting layer that passes through the substrate has an intensity in a luminescence peak wavelength of any one of the first color pixel and the second color pixel that is higher than that of the case of not having the insulator laminated film by reflection at, at least, interfaces between the light transmitting pixel electrodes and the insulator laminated film and interfaces between the low refractive-index layers and the high refractive-index layers.

2. The EL device according to claim 1,
wherein a combination of the thicknesses of the layers including the light transmitting electrode and the light-emitting layer from the light transmitting electrode to the light-emitting layer is different depending on the luminescence color of the pixel.

3. The EL device according to claim 1,
wherein the EL device is an organic EL device and an intermediate layer for reducing leakage of holes or electrons from the light-emitting layer toward the light transmitting electrode is provided between the light-emitting layer and the light transmitting electrode.

4. The EL device according to claim 1,
wherein color filters are provided at the light emitting side of the insulator laminated film.

5. An electronic apparatus comprising the EL device according to claim 1.

6. An electroluminescent device comprising:
a substrate;
pixels over the substrate, the pixels including a first color pixel which emits a first color light and a second color pixel which emits a second color light, the pixels including a common electrode, each of the first color pixel and the second color pixel including a light transmitting pixel electrode and an organic light-emitting layer between the common electrode and the corresponding light transmitting pixel electrode;

an insulator laminated film to a side of the light transmitting pixel electrodes that is opposite from a side at which the light-emitting layers are disposed, the insulator laminated film has a low refractive-index layer formed of a light transmitting insulator and a high refractive-index layer formed of a light transmitting insulator having a refractive index higher than the refractive index of the light transmitting insulator of the low refractive-index layer, the low refractive-index layer is formed over the entire luminescent region of the first color pixel and the second color pixel and has a substantially constant thickness in regions which overlap the first color pixel and the second color pixel, the high refractive-index layer is formed over the entire luminescent region of the first color pixel and the second color pixel, and has a substantially constant thickness in regions which overlap the first color pixel and the second color pixel, and the thicknesses of the low refractive-index layer and the high refractive-index layers are determined such that reflection at at least interfaces between the light transmitting pixel electrodes and the insulator laminated film and an interface between the low refractive-index layer and the high refractive-index layer causes a reflectance of light that exits from the insulator laminated film and falls incident on the light transmitting pixel electrodes and the organic light-emitting layer to be lower for a wavelength in ± 20nm of the luminescence peak wavelength of each of the first color pixel and the second color pixel than for any other wavelengths in ± 50nm of the luminescence peak wavelength, wherein the insulator laminated film has a plurality of low refractive-index layers and a plurality of high refractive-index layers, which are alternately laminated, the plurality of the low refractive-index layers have thicknesses that are different from each other, and the plurality of the high refractive-index layers have thicknesses that are different from each other.

7. An electroluminescent device comprising:
pixels including a first color pixel which emits a first color light and a second color pixel which emits a second color light, the pixels including a common electrode, each of the first color pixel and the second color pixel including a light transmitting pixel electrode and an organic light-emitting layer between the common electrode and the corresponding light transmitting pixel electrode;

an insulator laminated film to a side of the light transmitting pixel electrodes that is opposite from a side at which the light-emitting layers are disposed, the insulator laminated film has a low refractive-index layer formed of a light transmitting insulator and a high refractive-index layer formed of a light transmitting insulator having a refractive index higher than the refractive index of the light transmitting insulator of the low refractive-index layer, the low refractive-index layer is formed over the entire luminescent region of the first color pixel and the second color pixel and has a substantially constant thickness in regions which overlap the first color pixel and the second color pixel, the high refractive-index layer is formed over the entire luminescent region of the first color pixel and the second color pixel and has a substantially constant thickness in regions which overlap the first color pixel and the second color pixel, and the thicknesses of the low refractive-index layer and the high refractive-index layer are determined such that reflection at at least interfaces between the light transmitting pixel electrodes and the insulator laminated film and an interface between the low refractive-index layer and the high refractive-index layer causes a reflectance of light that exits from the insulator laminated film and falls incident on the light transmitting pixel electrodes and the organic light-emitting layer to be lower for a wavelength in ± 20 nm of the luminescence peak wavelength of each of the first color pixel and the second color pixel than for any other wavelengths in ± 50 nm of the luminescence peak wavelength, wherein the insulator laminated film has a plurality of low refractive-index layers and a plurality of high refractive-index layers, which are alternately laminated, the plurality of the low refractive-index layers have thicknesses that are different from each other, and the plurality of the high refractive-index layers have thicknesses that are different from each other.

* * * * *

UNITED STATES PATENT AND TRADEMARK OFFICE
CERTIFICATE OF CORRECTION

PATENT NO. : 7,605,535 B2  Page 1 of 1
APPLICATION NO. : 11/281555
DATED : October 20, 2009
INVENTOR(S) : Hidekazu Kobayashi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 521 days.

Signed and Sealed this

Fifth Day of October, 2010

David J. Kappos
*Director of the United States Patent and Trademark Office*